United States Patent
Luan et al.

(10) Patent No.: US 9,812,454 B2
(45) Date of Patent: Nov. 7, 2017

(54) METHODS AND SYSTEMS FOR REDUCING ELECTRICAL DISTURB EFFECTS BETWEEN THYRISTOR MEMORY CELLS USING BURIED METAL CATHODE LINES

(71) Applicant: Kilopass Technology, Inc., San Jose, CA (US)

(72) Inventors: Harry Luan, Saratoga, CA (US); Valery Axelrad, Woodside, CA (US); Charlie Cheng, Los Altos, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/199,934

(22) Filed: Jun. 30, 2016

(65) Prior Publication Data

US 2017/0229465 A1 Aug. 10, 2017

Related U.S. Application Data

(60) Provisional application No. 62/300,015, filed on Feb. 25, 2016, provisional application No. 62/292,547, filed on Feb. 8, 2016, provisional application No. 62/294,239, filed on Feb. 11, 2016, provisional application No. 62/294,270, filed on Feb. 11, 2016.

(51) Int. Cl.
| | |
|---|---|
| *H01L 29/74* | (2006.01) |
| *H01L 27/102* | (2006.01) |
| *H01L 23/532* | (2006.01) |
| *H01L 29/45* | (2006.01) |
| *H01L 21/8229* | (2006.01) |
| *H01L 21/285* | (2006.01) |

(52) U.S. Cl.
CPC .... *H01L 27/1027* (2013.01); *H01L 21/28518* (2013.01); *H01L 21/28525* (2013.01); *H01L 21/28562* (2013.01); *H01L 21/28568* (2013.01); *H01L 21/8229* (2013.01); *H01L 23/53209* (2013.01); *H01L 23/53242* (2013.01); *H01L 29/456* (2013.01)

(58) Field of Classification Search
CPC .......... H01L 27/1027; H01L 21/28518; H01L 21/28525; H01L 21/28562; H01L 21/28568; H01L 21/8229; H01L 23/53209; H01L 23/53242; H01L 29/456
USPC ....................................... 257/146
See application file for complete search history.

(56) References Cited

U.S. PATENT DOCUMENTS

| | | | | |
|---|---|---|---|---|
| 3,971,061 | A | * | 7/1976 | Matsushita ............. H01L 29/00 148/DIG. 118 |
| 5,434,434 | A | | 7/1995 | Kasahara et al. |
| 9,490,321 | B2 | | 11/2016 | Talor |
| 2007/0096203 | A1 | * | 5/2007 | Mouli ................. H01L 27/1027 257/330 |

(Continued)

OTHER PUBLICATIONS

U.S. Appl. No. 15/199,916, filed Jun. 30, 2016.

*Primary Examiner* — Tu-Tu Ho
(74) *Attorney, Agent, or Firm* — Aka Chan LLP

(57) ABSTRACT

Methods and systems for reducing electrical disturb effects between thyristor memory cells in a memory array are provided. Electrical disturb effects between cells are reduced by using a material having a reduced minority carrier lifetime as a cathode line that is embedded within the array. Disturb effects are also reduced by forming a potential well within a cathode line, or a one-sided potential barrier in a cathode line.

9 Claims, 20 Drawing Sheets

(56) References Cited

U.S. PATENT DOCUMENTS

2010/0127304 A1* 5/2010 Schulze .............. H01L 29/0619
257/109
2012/0275215 A1* 11/2012 Tsukada .............. H01L 27/1021
365/149

* cited by examiner

METHODS AND SYSTEMS FOR REDUCING ELECTRICAL DISTURB EFFECTS BETWEEN THYRISTOR MEMORY CELLS USING BURIED METAL CATHODE LINES

CROSS REFERENCE TO RELATED APPLICATIONS

This patent application claims priority from U.S. Provisional Patent Application No. 62/292,547, filed Feb. 8, 2016, and entitled "High Density Vertical Thyristor Memory Cell and Memory Array Using a Heterostructure Cathode", U.S. Provisional Patent Application No. 62/294,239, filed Feb. 11, 2016, and entitled "Vertical Thyristor Memory Cell with Minority Carrier Lifetime Reduction Dopants", and from U.S. Provisional Patent Application No. 62/294,270, filed Feb. 11, 2016, and entitled "Vertical Thyristor Memory Array with Metal Plug Wordlines", and from U.S. Provisional Patent Application No. 62/300,015, filed Feb. 25, 2016, and entitled "Vertical Cross-Point Thyristor Memory Cell and Memory Array with Buried Metal Access Lines".

FIELD OF THE DISCLOSURE

The disclosures described herein relate to semiconductor devices for information storage. The semiconductor devices can be used as volatile memories such as static random access memories (SRAMs) and dynamic random access memories (DRAMs).

BACKGROUND OF THE DISCLOSURE

The 1-transistor/1-capacitor (1T1C) cell has been the predominant memory cell used in DRAM devices for the last 30 years. Bit density has quadrupled every three years by lithographical scaling and ever increasing process complexity. Maintaining a sufficiently high capacitance value and low transistor leakage current has become a major problem for further scaling.

Alternative DRAM cells have been proposed to overcome the scaling challenges of conventional 1T1C DRAM technology. These alternative DRAM cells are described as follows.

Floating body DRAM (FBDRAM) is a single Metal Oxide Semiconductor Field Effect Transistor (MOSFET) built on either a silicon-on-insulator (SOI) (Okhonin, S., et al. "A SOI capacitor-less 1T-DRAM concept." SOI Conference, 2001 IEEE International. IEEE, 2001.) or in a triple-well with a buried n-implant (Ranica, R., et al. "A one transistor cell on bulk substrate (1T-Bulk) for low-cost and high density eDRAM." VLSI Technology, 2004. Digest of Technical Papers. 2004 Symposium on. IEEE, 2004.). The technology has yet to solve its data retention issues, particularly at scaled dimensions.

Various cell designs have been proposed based on the negative differential resistance (NDR) behavior of a pnpn thyristor. An active or passive gate may be used in these designs for trade-offs among switching speed, retention leakage, or operation voltage. The thin capacitively-coupled thyristor (TCCT), as described by U.S. Pat. No. 6,462,359, is a lateral pnpn thyristor constructed on an SOI substrate and has a coupling gate for increased switching speed. Due to its lateral 2D design and the need for a gate, the cell size can be much larger than the 1T1C cell (which is about 6~8$F^2$).

Recently, Liang in U.S. Pat. No. 9,013,918 described a pnpn thyristor cell that is constructed on top of a silicon substrate and operated in a forward and reverse breakdown regime for writing data into the cell. The use of epitaxial or chemical vapor deposition (CVD) processed semiconductor layers at the backend of a standard CMOS process adds on thermal cycles and etch steps that may degrade performance and yield of devices already fabricated on the substrate earlier in a fabrication process (e.g., during front-end processing). In addition, pnpn devices operated in the breakdown regime may pose challenges in process control and also power consumption. Additionally, depending on the breakdown mechanism (e.g., tunneling breakdown, avalanching breakdown, etc.) operation in the breakdown regime may pose challenges to long-term reliability of switching and data retention of these memory devices due to physical degradation of component materials.

Therefore, there is a need for a compact cell and array design that is not only small and reliable but also easy for integration and manufacturing.

SUMMARY

Vertical thyristors arranged in cross-point arrays offer a promising solution to the challenges described in the background of the disclosure. Methods and systems for reducing electrical disturb effects between thyristor memory cells in a memory array are provided herein.

In some embodiments, a cathode line connecting a first thyristor and second thyristor within a cross-point memory array is composed of a material that reduces a minority carrier lifetime within the cathode to reduce electrical disturb effects between the first thyristor and the second thyristor. The material may have a high conductivity in order to improve operating performance of the cross-point array of thyristor memory cells.

In some embodiments, a potential well may be formed within a cathode line connecting a first thyristor and a second thyristor within a cross-point memory array to confine minority carriers in order to reduce electrical disturb effects between the first thyristor and the second thyristor. The minority carriers may be collected from the potential well through an electrical contact to the potential well.

In some embodiments, a one-sided potential barrier may be formed in a cathode line connecting a first thyristor and a second thyristor within a cross-point memory array to divert minority carriers to a substrate contact in order to reduce electrical disturb effects between the first thyristor and the second thyristor.

In some aspects, a plurality of volatile memory cells are provided. The plurality of volatile memory cells includes a first silicon thyristor having a first cathode, a second silicon thyristor having a second cathode, a first cathode line, formed from a conductor material, connecting the first cathode of the first silicon thyristor and the second cathode of the second silicon thyristor, and a first isolation insulator region separating a first portion of the first silicon thyristor and a second portion of the second silicon thyristor. The isolation insulator region may be a trench isolation formed from silicon oxide.

In some embodiments, the conductor material may be a metal silicide material formed from a transition metal including at least one of a Group 9 metal and a Group 10 metal from the periodic table. In some embodiments, the metal silicide material may be formed from a transition metal including at least one of cobalt, platinum, palladium, and nickel. In some embodiments, the metal silicide material may be formed from a transition metal having a higher diffusivity than silicon during a silicidation reaction at a temperature less than 900 degrees Celsius. In some embodiments, the first cathode line may be a first metal silicide region merged with a second metal silicide region. In some embodiments, the first silicon thyristor includes a first anode, and the second silicon thyristor include a second anode. The first anode and the second anode may be single crystalline silicon regions formed by an epitaxial growth process.

In some aspects, a method for forming a plurality of volatile memory cells is provided. The method includes etching a plurality of layers including a first semiconductor layer of a first conductivity type (e.g., p-type or n-type), a second semiconductor layer of a second conductivity type (e.g., n-type or p-type), a third semiconductor layer of the first conductivity type, a fourth semiconductor layer of the second conductivity type, and a fifth semiconductor layer of the second conductivity type, to form a plurality of semiconductor stacks including a first semiconductor stack and to form a plurality of trenches to a depth below the fourth semiconductor layer. The plurality of trenches includes a first trench proximate to a first side of the first semiconductor stack and a second trench proximate to a second side of the first semiconductor stack. The method includes forming, subsequent to the etching, a first conductor region within the third semiconductor layer of the first semiconductor stack, and forming, subsequent to the forming of the first conductor region, an isolation insulator region within the plurality of trenches.

In some embodiments, the first conductor region includes a first metal silicide region. In some embodiments, the forming of the conductor region may include forming a first sacrificial layer within the plurality of trenches to a first thickness within the third semiconductor layer and forming a second sacrificial layer on top of the first sacrificial layer within the plurality of trenches to a second thickness within the third semiconductor layer. The forming of the conductor region may include forming spacers on the sidewalls of the first semiconductor stack, after forming the second sacrificial layer, and selectively etching the second sacrificial layer to remove the second sacrificial layer and expose portions of the sidewalls of the third semiconductor layer of the first semiconductor stack. The forming of the conductor region may include depositing a metal film of a transition metal, where the metal film contacts the exposed portions of the sidewalls of the third semiconductor layer. The forming of the metal silicide region may include heating the plurality of layers, after the depositing of the metal film, to a temperature less than 900 degrees Celsius to cause a reaction between the metal film and the exposed portions of the third semiconductor layer to form the first metal silicide region. In some embodiments, the transition metal may include at least one of a Group 9 metal and a Group 10 metal. In some embodiments, the transition metal may include at least one of cobalt, platinum, palladium, and nickel. In some embodiments, the transition metal may have a higher diffusivity than silicon during a silicidation reaction at the heating temperature.

In some embodiments, the exposed portions of the sidewalls of the first semiconductor stack include a first exposed portion of the sidewall and a second exposed portion of the sidewall. The heating of the plurality of layers further includes reacting the metal film and the first exposed portion of the sidewall to form a second metal silicide region and reacting the metal film and the second exposed portion of the sidewall to form a third metal silicide region until the second metal silicide region and the third metal silicide region connect to form the first metal silicide region.

In some embodiments, the method may further include forming, subsequent to the forming of the isolation insulator region within the plurality of trenches, a sixth semiconductor region of the second conductivity type on top of the first semiconductor layer of the first semiconductor stack using at least one of an epitaxial process or chemical vapor deposition process at a temperature less than 900 degrees Celsius.

In some embodiments, the first thickness of the first sacrificial layer is between 10 and 50 nanometers above an interface between the third semiconductor layer and the fourth semiconductor layer. In some embodiments, the combined thickness of the first thickness of the first sacrificial layer and the second thickness of the second sacrificial layer is between 5 and 20 nanometers. In some embodiments, the sacrificial layer includes at least one of carbon, silicon nitride, silicon oxide, and amorphous silicon.

In some aspects, a memory device is provided which includes an array of memory cells. The array of memory cells includes a first silicon thyristor having a first cathode, a second silicon thyristor having a second cathode, a third silicon thyristor, a first cathode line, formed from a conductor material and connecting the first cathode of the first silicon thyristor and the second cathode of the second silicon thyristor. The array includes a first isolation insulator region separating a first portion of the first silicon thyristor and a second portion of the second silicon thyristor, and a second isolation insulator region separating a third portion of the first silicon thyristor and a fourth portion of the third silicon thyristor.

In some embodiments, the conductor material includes a metal silicide material formed from the transition metal having a higher diffusivity than silicon during a silicidation reaction at a temperature less than 900 degrees Celsius. In some embodiments, the first cathode line includes a first metal silicide region merged with a second metal silicide region.

In some aspects, a plurality of volatile memory cells includes a first thyristor, formed from a first semiconductor material having a first bandgap and a first electron affinity, and a second thyristor formed from the first semiconductor material. The first thyristor includes a first cathode, and the second thyristor includes a second cathode. A first cathode line connects the first cathode of the first thyristor and the second cathode of the second thyristor. The first cathode lines is formed from a second semiconductor material having a second bandgap narrower than the first bandgap and a second electron affinity that is substantially the same as the first electron affinity. The first cathode line is formed on top of a second cathode line. A first isolation insulator region separating a first portion of the first thyristor and a second portion of the second thyristor.

In some embodiments, the first semiconductor material is silicon and the second semiconductor material is a silicon germanium compound having a germanium mole fraction between 10% to 50% and wherein the first cathode line has a thickness between 20 nanometers and 300 nanometers.

In some embodiments, a difference between a first valence band edge of the first semiconductor material and a second valence band edge of the second semiconductor material is greater than 100 milli-electron volts. In some embodiments, the second cathode line is formed from the first semiconductor material and is heavily doped with a dopant concentration that is substantially the same as a dopant concentration of the first cathode and the second cathode. In some embodiments, the first cathode line has a thickness greater than 50 nanometers. In some embodiments, the second cathode line has a thickness between 50 nanometers and 200 nanometers.

In some embodiments, the second cathode line is formed from a third semiconductor material having a variable composition of the first semiconductor material and a fourth semiconductor material. In some embodiments, the first semiconductor material is silicon, the third semiconductor material is a silicon germanium compound, and the variable composition varies from a mole fraction of 0% of germanium at a first interface between the first cathode line and the second cathode line, to a mole fraction between 20% and 50% of germanium at a second interface between the second cathode line and a substrate. The variable composition is linearly graded through the second cathode line between the first interface and the second interface.

In some aspects, a method of forming a plurality of memory cells is provided. The method includes forming a heavily doped first layer, having a thickness between 50 nanometers and 200 nanometers, on a substrate of a first semiconductor material having a first bandgap and a first electron affinity. The method also includes depositing, on the heavily doped first layer, a second layer of a second semiconductor material having a second bandgap narrower than the first bandgap and a second electron affinity that is substantially the same as the first electron affinity, wherein the second layer has a thickness between 20 nanometers and 200 nanometers. The method also includes depositing, on the second layer, a heavily doped third layer of the first semiconductor material. The method also includes depositing, on the heavily doped third layer, a lightly doped fourth layer of a first conductivity type, implanting a concentration of dopant of a second conductivity type into the lightly doped fourth layer, thereby dividing the fourth layer into a fifth layer on the third layer, and a sixth layer on the fifth layer. The method also includes etching the sixth layer, the fifth layer, the third layer and the second layer to a depth within the second layer to form a plurality of semiconductor stacks and a plurality of trenches between the plurality of semiconductor stacks. The method also includes forming an isolation insulator region within the plurality of trenches between the plurality of thyristors.

In some embodiments, the second semiconductor material is a silicon germanium compound having a mole fraction of germanium between 10% and 50%. In some embodiments, the implanting of the concentration of dopant of the second conductivity type into the lightly doped fourth layer divides the fourth layer into the fifth layer, the sixth layer, and a seventh layer on the sixth layer. In some embodiments, the method further includes etching the seventh layer prior to etching the sixth layer.

In some embodiments, the method further includes forming, subsequent to the forming of the isolation insulator region, a semiconductor region on top of the sixth layer of the plurality of semiconductor stacks using at least one of an epitaxial process or chemical vapor deposition process at a temperature less than 900 degrees Celsius. The depositing of the second layer may include depositing the second layer under strain caused by a lattice mismatch between the second layer of the second semiconductor material and the first layer. The heavily doped third layer may have a thickness between 20 nanometers and 300 nanometers.

In some aspects, a method of forming a plurality of memory cells is provided. The method includes forming on a substrate of a first semiconductor material having a first bandgap and a first electron affinity, a lightly doped first layer including a second semiconductor material having a variable composition of the first semiconductor material and a third semiconductor material. The method also includes depositing, on the lightly doped first layer, a second layer of a fourth semiconductor material having a second bandgap narrower than the first bandgap and a second electron affinity that is substantially the same as the first electron affinity. The method also includes depositing, on the second layer, a heavily doped third layer of the first semiconductor material. The method also includes depositing on the heavily doped third layer, a lightly doped fourth layer of a first conductivity type, implanting a concentration of dopant of a second conductivity type into the lightly doped fourth layer, thereby dividing the fourth layer into a fifth layer on the third layer, and a sixth layer on the fifth layer. The method also includes etching the sixth layer, the fifth layer, the third layer and the second layer to a depth within the second layer to form a plurality of semiconductor stacks and a plurality of trenches between the plurality of semiconductor stacks. The method also includes forming an isolation insulator region within the plurality of trenches between the plurality of thyristors.

In some embodiments, the first semiconductor material is silicon, the second semiconductor material is a silicon germanium compound, the third semiconductor material is germanium, the variable composition of the second semiconductor material varies from a mole fraction of 0% of germanium at a first interface between the substrate and the first layer to a mole fraction between 20% and 50% of germanium at a second interface between the first layer and the second layer. In some embodiments, the fourth semiconductor material is a second silicon germanium compound having a mole fraction between 20% and 50% of germanium.

In some embodiments, the implanting of the concentration of dopant of the second conductivity type into the lightly doped fourth layer divides the fourth layer into the fifth layer, the sixth layer, and a seventh layer on the sixth layer. The method may further include etching the seventh layer prior to etching the sixth layer. The method may further include forming, subsequent to the forming of the isolation insulator region, a semiconductor region on top of the sixth layer of the plurality of semiconductor stacks using at least one of an epitaxial process or chemical vapor deposition process at a temperature less than 900 degrees Celsius. The first layer may have a thickness between 50 nanometers and 100 nanometers.

In some aspects, a plurality of volatile memory cells are provided. The plurality of volatile memory cells includes a first thyristor, formed from a first semiconductor material having a first bandgap and a first electron affinity, and a second thyristor, formed from the first semiconductor material. The first thyristor includes a first cathode and the second thyristor includes a second cathode. A first cathode line connects the first cathode and the second cathode. The first cathode line may be formed from a second semiconductor material having a second bandgap narrower than the first bandgap and a second electron affinity that is substantially the same as the first electron affinity. The plurality of volatile memory cells further includes a second cathode line formed from the first semiconductor material, where the first cathode line is formed on top of the second cathode line, and a first isolation insulator region separating a first portion of the first thyristor and a second portion of the second thyristor.

In some aspects, a plurality of volatile memory cells are provided. The plurality of volatile memory cells includes a first thyristor, formed from a first semiconductor material having a first bandgap and a first electron affinity. The first thyristor includes a first cathode. The plurality of volatile memory cells includes a second thyristor, formed from the first semiconductor material, where the second thyristor includes a second cathode. The plurality of volatile memory cells includes a first cathode line, formed from a second semiconductor material having a second bandgap narrower than the first bandgap and a second electron affinity that is substantially the same as the first electron affinity, the first cathode line connecting the first cathode of the first thyristor and the second cathode of the second thyristor. The plurality of memory cells includes a second cathode line formed from a third semiconductor material having a variable composition of the first semiconductor material and a fourth semiconductor material, where the first cathode line is formed on top of the second cathode line and where the variable composition varies from a mole fraction of 0% of the fourth semiconductor material at a first interface between the first cathode line and the second cathode line, to a mole fraction between 20% and 50% of the fourth semiconductor at a second interface between the second cathode line and a substrate. The plurality of memory cells further includes a first isolation insulator region separating a first portion of the first thyristor and a second portion of the second thyristor.

It should be noted that the devices, methods, apparatuses, and/or aspects described above may be applied to, or used in accordance with, other devices, methods, apparatuses, and/or aspects.

BRIEF DESCRIPTION OF THE DRAWINGS

The above and other aspects and potential advantages of the present disclosure will be apparent upon consideration of the following detailed description, taken in conjunction with the accompanying drawings, in which like reference characters refer to like parts throughout, and in which:

FIGS. 4A to 15A and FIGS. 4B to 15B illustrate cross-sectional views of a cell array as part of a process for manufacturing an array of thyristor memory cells that includes an MCLK region in accordance with some embodiments of the present disclosure;

DETAILED DESCRIPTION

Figure 1:
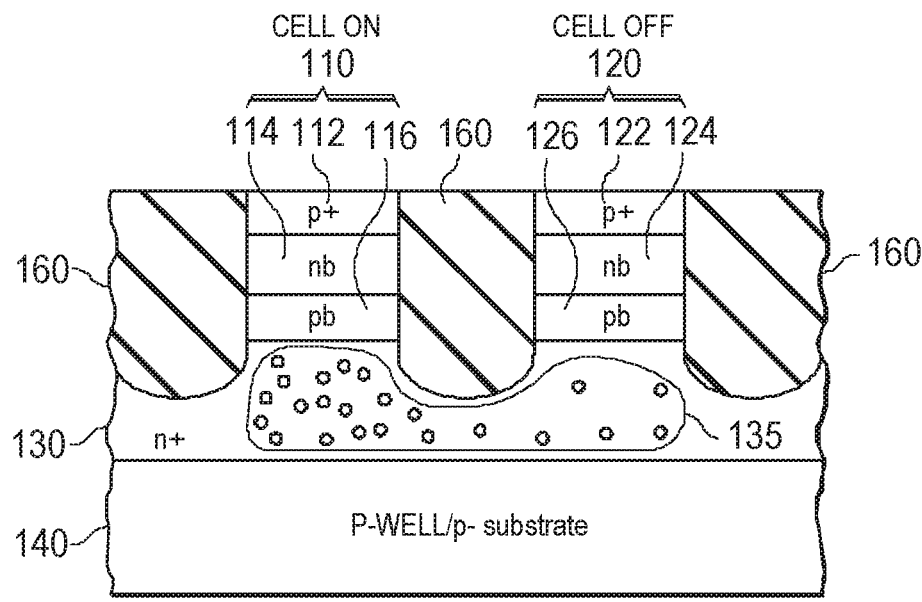
FIG. 1 is a cross-sectional view that illustrates a possible disturb mechanism between neighboring cells, in accordance with some embodiments of the present disclosure.

Vertical thyristors arranged in cross-point arrays offer a promising solution to the challenges described in the background of the disclosure. Advantages of thyristors include the ability to precisely tune operating characteristics (e.g., switching speed, static power consumption, dynamic power consumption, etc.) by tuning the geometry and composition of component layers of each thyristor cell. Vertical thyristors may be arranged as an array of minimum $4F^2$ cells, thereby minimizing cell area and reducing fabrication cost. Vertical thyristors may also be arranged in a stacked configuration to further increase the density of memory cells in a cross-point array.

Vertical thyristors may be arranged in a cross-point array of cells electrically isolated, for example, by trench isolation. As the isolation trenches in thyristor memories become narrower as the thyristor memories are scaled to smaller dimensions, minority carriers from ON cells can diffuse to neighboring OFF cells. This diffusion of minority carriers from ON cells to OFF cells either causes disturbance of the OFF cells during write operations of neighboring ON cells, read operations of neighboring ON cells or neighboring OFF cells, or reduces the retention lifetime of ON cells and neighboring OFF cells. For example, during a write operation of an ON cell, diffusion of minority carriers from the ON cell to a neighboring OFF cell may cause the OFF cell to transition to an ON state. For example, during a read operation of the ON cell, diffusion of minority carriers from the ON cell to the OFF cell may cause the ON cell to transition to an OFF state. Analogously, during a read operation of an OFF cell, diffusion of minority carriers into the OFF cell from the ON cell may cause the OFF cell to transition to an ON state. During retention, an OFF cell may transition to an ON state as minority carriers from a neighboring ON cell diffuse into the OFF cell.

Some solutions to these disturb effects include making the trench isolation deeper and/or wider so that these minority carriers can recombine before they reach any OFF cells. The disadvantages associated with forming a deeper trench isolation include the difficulty of etching a deeper high aspect ratio trench and subsequently filling in the deeper trench to form the deeper trench isolation. As an example of a difficulty associated with forming a deeper high aspect ratio trench, ballooning effects may occur during a reactive ion etching (RIE) step that is used to form the high aspect ratio trench. Additionally, the forming of a sidewall passivation layer as part of an RIE step may limit the maximum aspect ratio of a trench. Also, as thyristors are scaled to smaller lateral dimensions, the forming of deeper trenches to separate the thyristors also increases the aspect ratio of semiconductor stacks that make up those thyristors. As the aspect ratio of those semiconductor stacks increases, the mechanical stability of the semiconductor stacks may be adversely affected, thereby adversely affecting performance and yield of the thyristors. An example of a difficulty associated with filling in a deeper trench, keyhole effects during filling of a deep trench by conformal deposition methods may affect reliability of a memory cell array. The disadvantages of using a wider isolation trench include a large cell size that reduces cell density and increases the cost of a memory device.

This application explores techniques for reducing disturb effects caused by minority carrier diffusion from ON cells to OFF cells across a cathode line connecting the cells, by reducing minority carrier lifetime within the cathode line, or by directing flow minority carriers within the cathode line by engineering the energy band structure. As a consequence of reducing the disturb effects between ON cells and OFF cells, shallower trench isolations, narrower trench isolations, or a combination thereof, may be used to fabricate a cross-point memory array, thereby reducing area of the cross-point memory array and/or complexity of the fabrication process.

FIG. 1 is a cross-sectional view that illustrates of a possible disturb mechanism between neighboring thyristor cells within a memory array in accordance with some embodiments of the present disclosure. The memory array includes a first thyristor 110, and a second thyristor 120 separated by isolation insulator region 160. Isolation insulator region 160 may be composed of Silicon Dioxide or Silicon Oxide (collectively referred to as "oxide") formed by a shallow trench isolation (STI) technique. First thyristor 110 and second thyristor 120 share a common cathode 130, which also serves as a cathode line connecting the first thyristor 110 to the second thyristor 120. In some embodiments, first thyristor 110 and second thyristor 120 are fabricated in a a well of a first conductivity type (e.g., a p-well for a pnpn thyristor structure or an n-well for an npnp thyristor structure) on a substrate. As referred to herein, the term "pnpn thyristor structure" shall be used to describe a thyristor structure that is formed from a stack of p-type material, n-type material, p-type material, and then n-type material, from a top surface of the thyristor structure toward a substrate. As referred to herein, the term "npnp thyristor structure" shall be used to describe a thyristor structure that is formed from a stack of n-type material, p-type material, n-type material, and then p-type material, from a top surface of the thyristor structure toward a substrate.

First thyristor 110 may be composed of a plurality of layers including a first semiconductor layer 112 of a first conductivity type (e.g. p-type in a pnpn thyristor structure or n-type in an npnp thyristor structure), a second semiconductor layer 114 of a second conductivity type (e.g., n-type pnpn thyristor structure or p-type in an npnp thyristor structure), a third semiconductor layer 116 of the first conductivity type (e.g. p-type in a pnpn thyristor structure or n-type in an npnp thyristor structure), a fourth semiconductor layer 130 of the second conductivity type (e.g., n-type pnpn thyristor structure or p-type in an npnp thyristor structure), and a fifth layer of the first conductivity type. For example, first thyristor 110 may be composed of a multi-layer structure including a p+ doped layer 112 (e.g., an anode), n– doped layer 114 (e.g., a first base), p– doped layer 116 (e.g., a second base), and n+ doped layer 130 (e.g., a cathode). Second thyristor 120 may be similarly composed of a multi-layer structure. For example, second thyristor 210 may be composed of a multi-layer structure including a p+ doped layer 122 (e.g., an anode), n– doped layer 124 (e.g., a first base), p– doped layer 126 (e.g., a second base), and n+ doped layer 130 (e.g., a cathode). Although each of the p+ doped layers 112 and 122 have been referred to as an anode above, each may also serve as a cathode depending on the electrical operation of each respective thyristor. Although the n+ doped layer 130 has been referred to as a cathode above, it may also serve as an anode depending on the electrical operation of each respective thyristor.

As referred to herein, the terms "n+" and "p+" shall respectively refer to heavily doped n-type and p-type semiconductors. For example, an n+ doped layer of silicon may be doped by n-type dopant such as arsenic, phosphorous, another group 15 element (as understood under the new IUPAC system) or any other suitable n-type dopant, to a concentration that is greater than or equal to approximately $1E18$ dopants/cm$^3$. For example, a p+ doped layer of silicon may be doped by p-type dopant such as boron, another group 13 element (as understood under the new IUPAC system) or any other suitable p-type dopant, to a concentration that is greater than or equal to approximately $1E18$ dopants/cm$^3$. For example, a heavily doped material may be doped at a concentration where the Boltzmann approximation to Fermi Dirac statistics no longer applies. For example, a heavily doped material may be doped to a degenerately doped condition. As referred to herein, the terms "n–" and "p–" shall respectively refer to lightly doped n-type and p-type semiconductors. For example, an n– doped layer of silicon may be doped by n-type dopant such as arsenic, phosphorous, another group 15 element, or any other suitable n-type dopant, to a concentration equal to or less than approximately $1E15$ dopants/cm$^3$. For example, a p– doped layer of silicon may be doped by p-type dopant such as boron, another group 13 element, or any other suitable p-type dopant, to a concentration equal to or less than approximately $1E15$ dopants/cm$^3$.

Although FIG. 1 is illustrated such that first thyristor 110 is labeled with regions 112, 114, and 116 as separate from regions 122, 124, and 126 of second thyristor 120, it should be understood that regions 112 and 122 may be formed from a same first semiconductor layer, that regions 114 and 124 may be formed from a same second semiconductor layer, and that regions 116 and 126 are formed from a same third semiconductor layer.

Although first thyristor 110 and second thyristor 120 are illustrated as pnpn structures with p+ heavily doped layers 112, 122, and n+ doped cathode layer 130, it should be understood that first thyristor 110 and second thyristor 120 may be implemented as npnp structures, other suitable doping profiles, or any combination of heterojunction structures. For an ON cell (e.g., first thyristor 110) either during turn-on switching or at retention hold, minority holes 135 are injected into the n+ cathode 130 from the p– base 116 and diffuse away from the ON cell (e.g., including first thyristor 110) as they gradually recombine with majority electrons within the cathode 130. Since minority holes have a diffusion length up to micrometer range, even in heavily doped regions (e.g., in cathode 130), some of these holes can diffuse to nearby OFF cells (e.g., second thyristor 120) and cause them to switch into meta stable or ON states. A simplistic solution is to increase the nearest p– base (e.g., p– base 126) junction spacing close to the diffusion length by using a deeper or wider trench isolation. A challenge with using a deeper trench isolation is greater complexity in fabrication process as discussed above, and a challenge with using a wider trench isolation is a larger cell size which makes scaling difficult.

First Type

One solution to reduce disturb effects between thyristor cells is to create a minority carrier lifetime killer (MCLK) region inside a cathode or cathode line such that minority carriers recombine before they can diffuse into nearby OFF cells. As referred to herein, minority carriers shall be understood to refer to a type of charge carrier (e.g., electrons or holes)

within a semiconductor material that is less abundant in concentration at a given operating temperature than corresponding majority carriers. For example, in an n-type material, the minority carrier are holes, while the majority carriers are electrons. For example, in a p-type material, the minority carriers are electrons, while the majority carriers are holes. It should also be understood that minority carriers within a first semiconductor region may be considered majority carriers when they cross into a second semiconductor region. For example, in a pn diode, minority carrier electrons within a p-type doped material of the diode become majority carriers when they cross an interface from the p-type doped material of the diode into an n-type doped material of the diode.

As referred to herein, a minority carrier lifetime shall be understood to refer to the average time required for a minority carrier to recombine with a majority carrier within a material. Factors that affect minority carrier lifetime include a concentration of recombination centers within a material. As the number of recombination centers increases, the minority carrier lifetime decreases. A minority carrier diffusion length is related to a minority carrier lifetime by:

$$L=\sqrt{(DT)} \quad \text{(EQ. 1)}$$

where the minority carrier diffusion length (L) is equal to the square root of the product of a diffusivity of the minority carrier (D) and the minority carrier lifetime (T).

As referred to herein, a minority lifetime carrier killer region, an MCLK region, an MCLK material, minority carrier lifetime attenuator (MCLA) region, an MCLA region, an MCLA material, reduced minority carrier lifetime (RMCL) region, an RMCL region, or an RMCL material shall be understood to be any material or region that reduces a minority carrier lifetime. For cell performance considerations, it is also desirable that the introduced MCLK region does not significantly increase resistance of a cathode or cathode line and does not affect thyristor switching characteristics. Increased resistance of a cathode or cathode line would reduce speed of read and write operations to a thyristor cell connected to a cathode or cathode line of higher resistance. Increased resistance of the cathode or cathode line may also constrain the maximum dimensions of a cross-point array due to cumulative resistive drops across segments of the cathode. Such cumulative resistive drops reduce read margin from memory cells located near the center of the array. Examples of MCLK materials include metal, metal silicide, chalcogenide, metal oxide, in-situ or ex-situ doped n+ or p+ silicon, any other suitable compounds or any combination thereof.

In some embodiments of an MCLK region, a conductor is embedded inside a cathode or a cathode line, where the conductor is physically positioned along the pathway of minority carrier diffusion from ON cells to OFF cells. A conductor, such as a metal or metal silicide, meets these requirements because those materials not only have low resistivity (for example, less than 40 µΩ-cm) but also have short minority carrier lifetimes that eliminate minority carriers very effectively. Other suitable materials that may serve as an MCLK material include chalcogenides, metal oxides, or any other suitable material. These MCLK materials can have low electrical resistivity and therefore high electrical conductivity, and can also have a high density of trap states that facilitate recombination, thereby reducing minority carrier lifetime.

Figure 2:
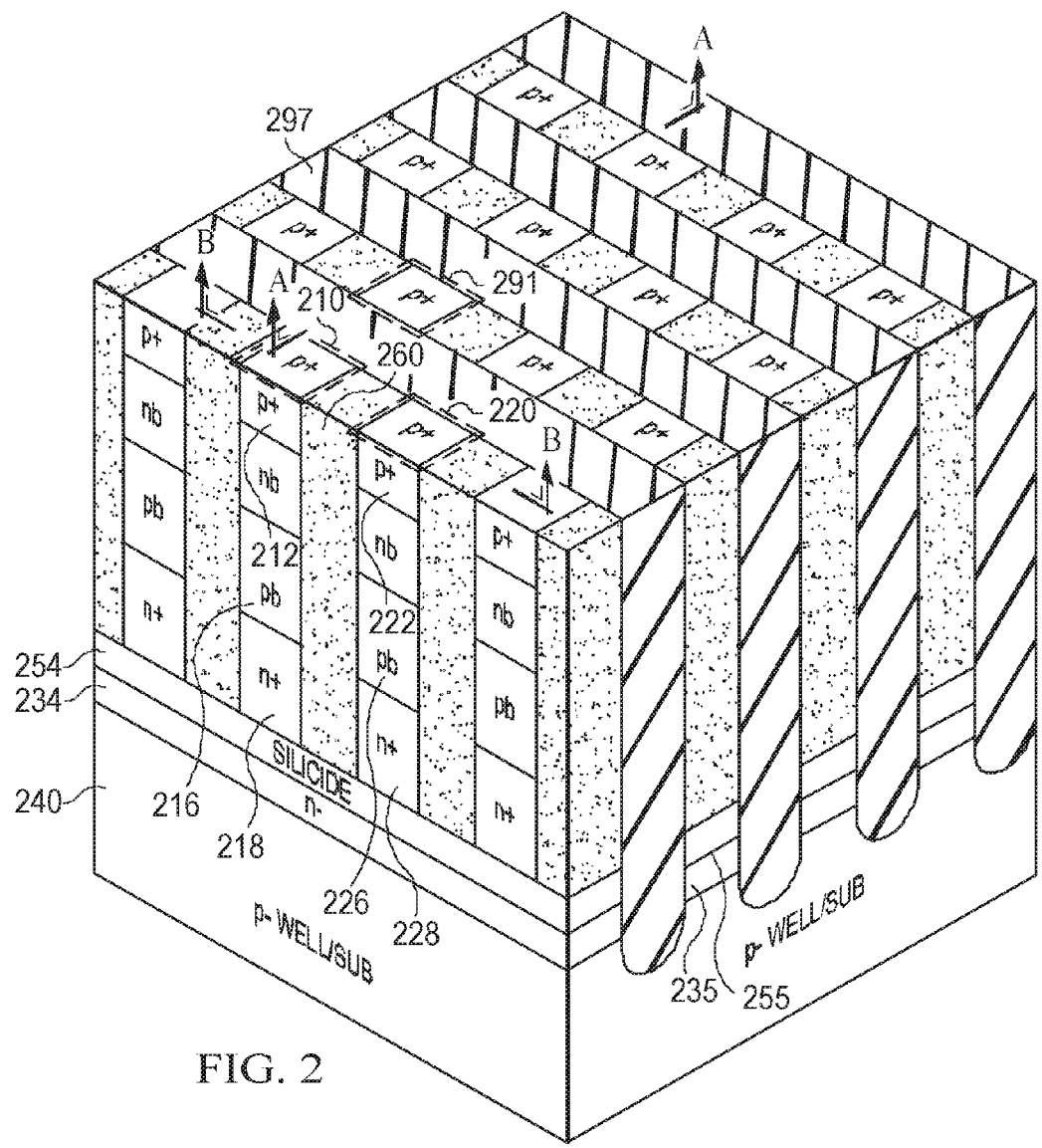
FIG. 2 illustrates a 4×4 cell array that includes a minority carrier lifetime killer (MCLK) region in accordance with some embodiments of the present disclosure.

FIG. 2 illustrates a 4×4 cell array using the first embodiment of this disclosure. In this cell design, a primary cathode line 254 (e.g., formed from a metal, metal silicide, or any other suitable MCLK region) is separated from another primary cathode line 255 by a trench isolation 297 that extends deeper than the primary cathode lines (e.g., 254, 255). Each primary cathode line (e.g., 254, 255) contacts multiple vertical pnpn thyristors (e.g., 210, 220, 291) above the cathode lines. For example, the primary cathode line 254 contacts to pnpn thyristors 210 and 220 above primary cathode line 254. The primary cathodes lines (e.g., 254, 255) are oriented in the direction labeled B-B'. Anode access lines (not shown) connect to top p+ regions in directions orthogonal to the primary cathode lines (e.g., 254, 255). For example, an anode access line connects to the top p+ regions of thyristors 210 and 291 in the direction labeled A-A'. In some embodiments, each primary cathode line (e.g., 254, 255) is formed above a respective secondary cathode line (e.g., 234, 235) in order to lower capacitance between the respective primary cathode line and substrate 240. For example, the secondary cathode line (234, 235) may be an n– doped region that lowers capacitance due to a higher depletion width at a junction between the secondary cathode line (e.g., 234, 235) and the substrate 240, leading to a lower junction capacitance.

Because minority carriers generated by an ON cell (e.g., 210) flow into a primary cathode line (e.g., 254) and recombine therein, fewer minority carriers diffuse to a neighboring OFF cell (e.g., 220 located on the same primary cathode line in the direction labeled B-B'). For example, fewer minority carriers can diffuse from cathode 218 of cell 210 through cathode line 254 through cathode 228 and base 226 of cell 220. Accordingly, because fewer minority carriers diffuse to the neighboring OFF cell, cell disturbance effects on the neighboring OFF cell are reduced. Additionally, the use of buried primary cathode lines, composed for an MCLK material such as metal or metal silicide, eliminates parasitic pnp bipolar junction transistors (BJTs) between a cell (e.g., 210) and substrate 240. For example, in reference to FIG. 1, a parasitic pnp BJT may be formed by a p– base 116, an n+ cathode 130 and p– substrate 140. In reference to FIG. 2, forming a primary cathode line 254 from an MCLK region, between a p– base 216, n+ cathode 218, and p– substrate 240 eliminates the parasitic pnp BJT. Thus, because the parasitic BJT is eliminated, anode current from an anode access line (not shown) may flow entirely through a cell (e.g., 210) through an anode (e.g., 212), through a cathode (e.g., 218) and then through a primary cathode line (e.g., 254). This further enables read operations from a primary cathode line (e.g., 254, 255), in addition to or as an alternative to the anode line (not shown).

The elimination of the parasitic BJT also reduces disturb effects between neighboring cells in the direction of the anode access lines (e.g., in the direction labeled A-A'). For example, disturb effects between neighboring cells 210 and 291 may be reduced. The reduction of disturb effects between thyristor cells (e.g., 210, 291) in the direction of the anode access lines (e.g., in the direction labeled A-A') facilitates use of shallower trench isolation between the thyristor cells (e.g., 210, 291). For example, a depth of a trench isolation (e.g., 297) separating a first cell (e.g., 210) from a second cell (e.g., 291) and may be reduced from 700 nm to 400 nm, nearly a 2× reduction.

The primary cathode lines (e.g., 254, 255) depicted in FIG. 2 can be conductor regions composed of any suitable MCLK material. Although the primary cathode lines (e.g., 254, 255) are depicted as aligned to an edge of a trench isolation (e.g., 297) in the drawing, each primary cathode line can encroach into the n+ cathode regions. Although FIG. 2 has been described in the context of pnpn thyristor memory cells, it should be understood that the concepts described therein could apply to npnp thyristor cells, or any other types of cells in cross-point memories.

Figure 3:
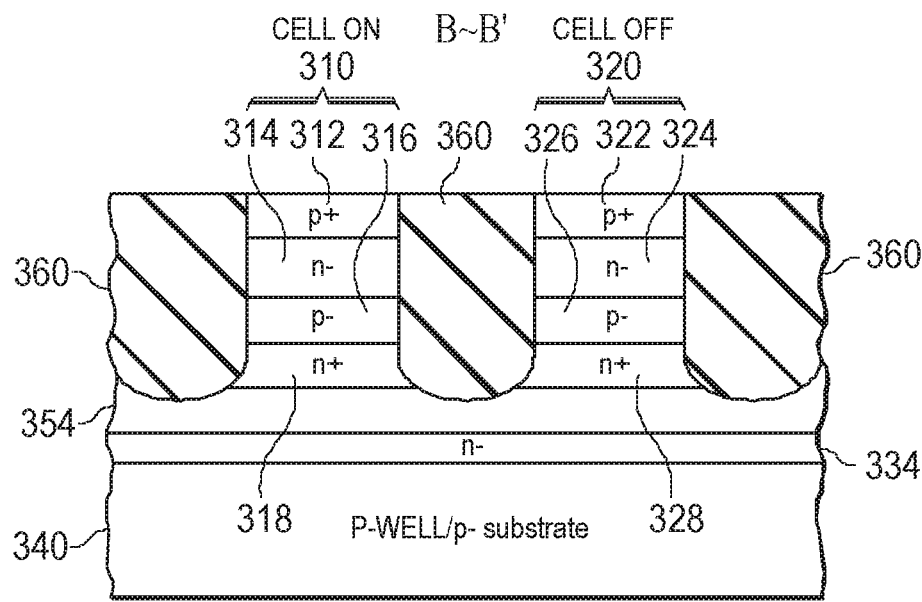
FIG. 3 illustrates a cross-sectional view of a cell array.

FIG. 3 illustrates a cross-sectional view of a cell array in accordance with some embodiments of the present disclosure that include an MCLK region. The cross-sectional view illustrated in FIG. 3 is similar to the cross-sectional view labeled B-B' in FIG. 2. The cross-sectional view illustrated in FIG. 3 is also similar to a cross-sectional view illustrated in FIG. 1. FIG. 3 includes a first thyristor 310, a second thyristor 320, and an isolation insulator region 360 separating the first thyristor 310 and second thyristor 320. The first thyristor 310 of FIG. 3 may correspond to first thyristor 110 of FIG. 1, and thyristor 210 of FIG. 2. The second thyristor 320 may correspond to second thyristor 120 of FIG. 1 and thyristor 220 of FIG. 2. Isolation insulator region 360 may correspond to isolation insulator region 160 of FIG. 1 and isolation insulator region 260 of FIG. 2.

First thyristor 310 may be composed of a plurality of layers, including a first semiconductor layer 312 of a first conductivity type (e.g., p-type in a pnpn thyristor structure or n-type in an npnp thyristor structure), a second semiconductor layer 314 of a second conductivity type (e.g., n-type pnpn thyristor structure or p-type in an npnp thyristor structure), a third semiconductor layer 316 of the first conductivity type (e.g., p-type in a pnpn thyristor structure or n-type in an npnp thyristor structure), or a fourth semiconductor layer 318 of the second conductivity type (e.g., n-type pnpn thyristor structure or p-type in an npnp thyristor structure).

For example, first thyristor 310 may be composed of a multi-layer structure including a p+ doped layer 312 (e.g., an anode), an n− doped layer 314 (e.g., a first base), a p− doped layer 316 (e.g., a second base), and an n+ doped layer 318 (e.g., a cathode). Second thyristor 320 may be similarly composed of a multi-layer structure. For example, second thyristor may be composed of a multi-layered structure including a p+ doped layer 322 (e.g., an anode), an n− doped layer 324 (e.g., a first base), a p− doped layer 326 (e.g., a second base), and an n+ doped layer 328 (e.g., a cathode). Although each of the p+ doped layers 312 and 322 have been referred to as an anode above, each may also serve as a cathode depending on the electrical operation of each respective thyristor. A primary cathode line 354, composed of an MCLK material, connects a first cathode 318 of the first thyristor 310 and a second cathode 328 of the second thyristor 320. In some embodiments, the primary cathode line 354 is formed above a secondary cathode line 334, which is formed on a substrate 340. The secondary cathode line may be composed of a lightly doped semiconductor region of the second conductivity type. For example, the secondary cathode may be composed of n− silicon.

FIGS. 4A to 15A and FIGS. 4B to 15B illustrate cross-sectional views of a cell array as part of a process for manufacturing an array of thyristor memory cells that includes an MCLK region in accordance with some embodiments of the present disclosure. For example, FIGS. 4A to 15A and 4B to 15B may illustrate the process of making the thyristor structure shown in the embodiment illustrated in FIG. 2. Each of FIGS. 4A to 15A is illustrated as a cross-sectional view along an anode line (e.g., along a direction labeled A-A' in FIG. 2). Each of FIGS. 4B to 15B is illustrated as a cross-sectional view along a cathode line (e.g., along a direction labeled B-B' in FIG. 2). Although the structure in FIGS. 4A and 4B is illustrated using pnpn thyristor structures fabricated from doped silicon, the process steps described may be used to apply to npnp thyristor structures fabricated from doped silicon or to thyristor heterostructures composed of heterojunctions between compound semiconductors (e.g., GaAs, InAs, SiGe and any other suitable compound semiconductor).

Figure 4A:
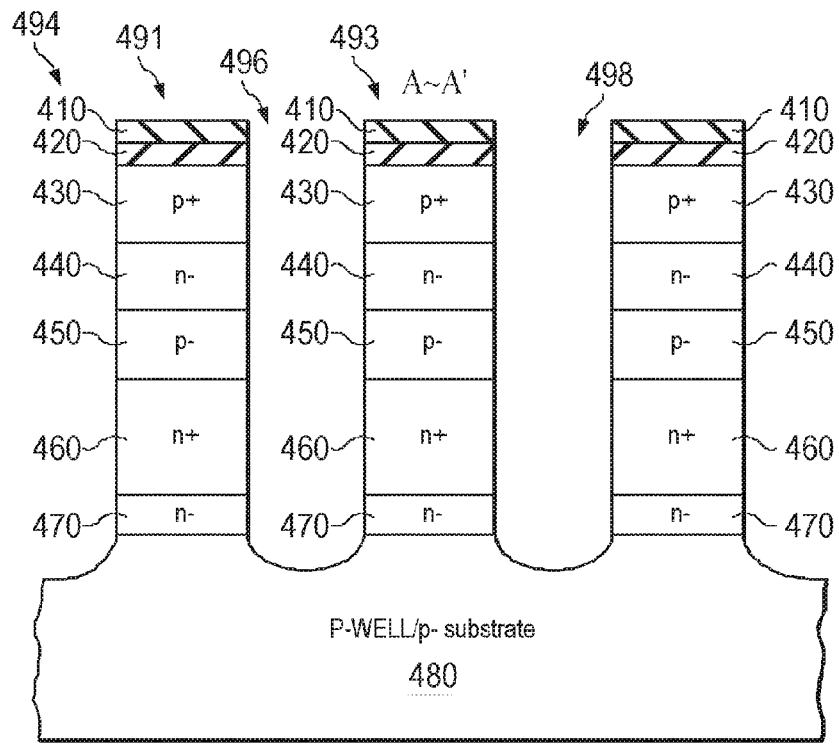
Figure 4B:
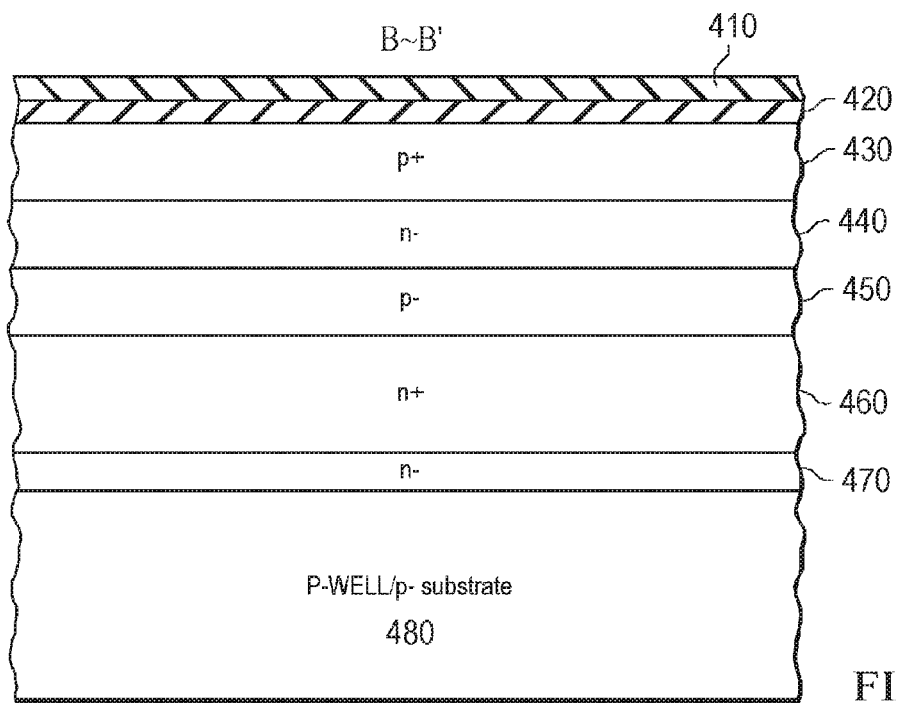

FIGS. 4A and 4B illustrate cross-sectional views of a structure, including nitride layer 410 (e.g., composed of silicon nitride or any other suitable material for a hard mask), pad oxide layer 420 (e.g., composed of silicon dioxide or any other suitable buffer layer), p+ layer 430, n− layer 440, p− layer 450, n+ layer 460, and n− layer 470, fabricated on a p− substrate 480. Each of layers 430, 440, 450, 460, 470 and substrate 480 may be composed of silicon, silicon germanium, or any other suitable semiconductor. FIGS. 4A and 4B illustrate the structure after lithography and etch are performed to define a plurality of parallel stripes in nitride layer 410 and pad oxide layer 420 along the anode line as illustrated in FIG. 4A. For example, the plurality of parallel stripes is formed at positions along the anode line in the direction labeled A-A' in FIG. 2, and each of the parallel stripes runs parallel to the direction labeled B-B' in FIG. 2. The nitride layer (410) and pad oxide layer (420) are etched to form a hard mask that is used to etch silicon trenches to a depth below the n− layer 470. For example, the plurality of layers, including p+ layer 430, n− layer 440, p− layer 450, n+ layer 460, n− layer 470 and p− substrate 480, may be etched to the depth below n− layer 470 into p− substrate 480 using any suitable dry etching process (e.g., RIE, plasma etching, sputtering, or any other suitable dry etching process) or wet etching process. The etching of the plurality of layers results in a plurality of semiconductor stacks (491, 493) separated by a plurality of trenches (494, 496, 498). After the etching process, each of the semiconductor stacks (491, 493) may be a stripe of layers that may include portions of nitride layer 410, portions of pad oxide layer 420, portions of p+ layer 430, portions of p− layer 440, portions of p− layer 450, portions of n+ layer 460, and portions of n− layer 470. FIG. 4B illustrates the structure along the cathode line (e.g., in the direction labeled B-B' in FIG. 2).

Figure 5A:
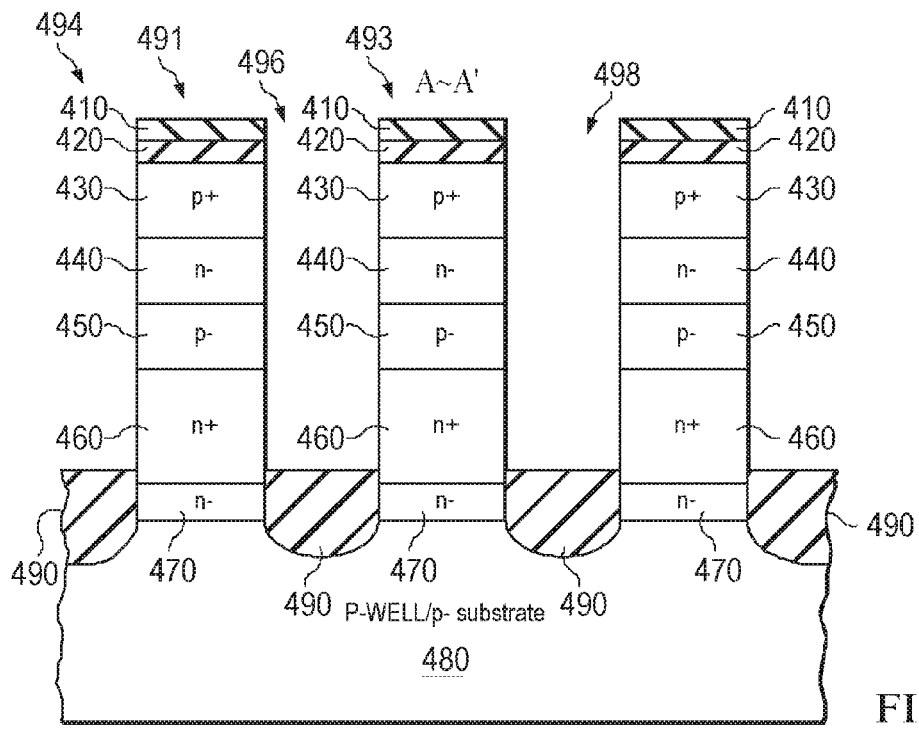
Figure 5B:
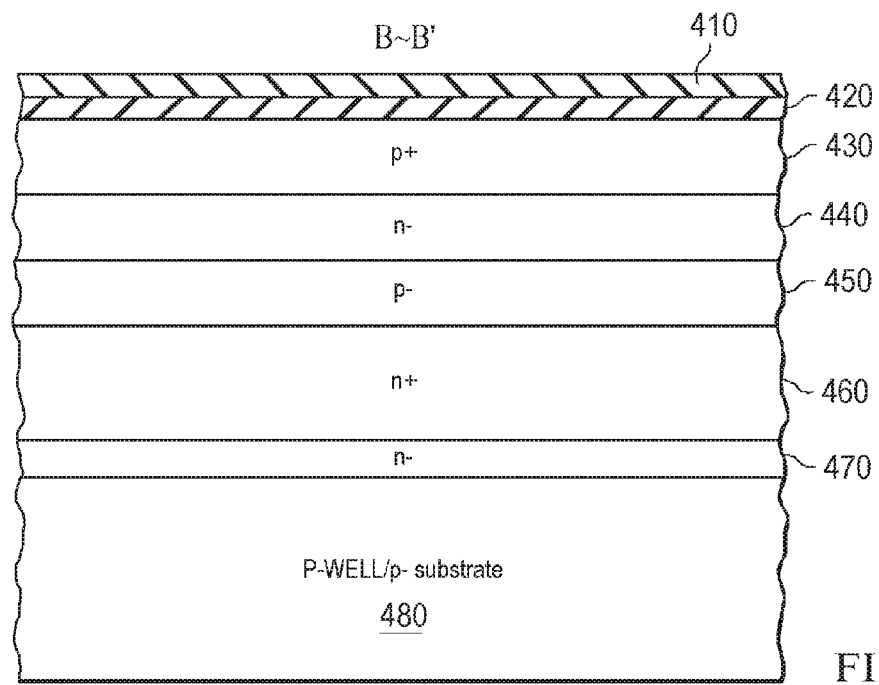

FIGS. 5A and 5B illustrate cross-sectional views of the structure of FIGS. 4A and 4B after an insulator 490 (e.g., silicon dioxide, silicon nitride, or any other suitable insulator) is deposited, planarized, and etched back. The insulator may be deposited using an anisotropic or non-conformal deposition method (e.g., sputtering, plasma-enhanced chemical vapor deposition (PECVD), or any other suitable anisotropic or non-conformal deposition method), or using an isotropic or conformal deposition method (e.g., chemical vapor deposition (CVD) or any other suitable isotropic or conformal deposition method). The insulator may also be grown conformally (e.g., by wet or dry thermal oxidation) along the sidewalls of the semiconductor stacks (491, 493) and bottoms of the plurality of trenches (491, 493, 498). If the etching step leaves a passivation layer on the sidewalls that is impermeable to oxidative species such as oxygen and water, the insulator may be selectively grown at the bottoms of the plurality of trenches (491, 493, 498). An anisotropic or non-conformal deposition method may be used to avoid the formation of spacers on the sidewalls of the trenches. In some embodiments, the remaining insulator (490) covers the bottoms of the plurality of trenches to a level 10 nm-50 nm above the n+/n− junction between n+ layer 460 and n− layer 470.

Figure 6A:
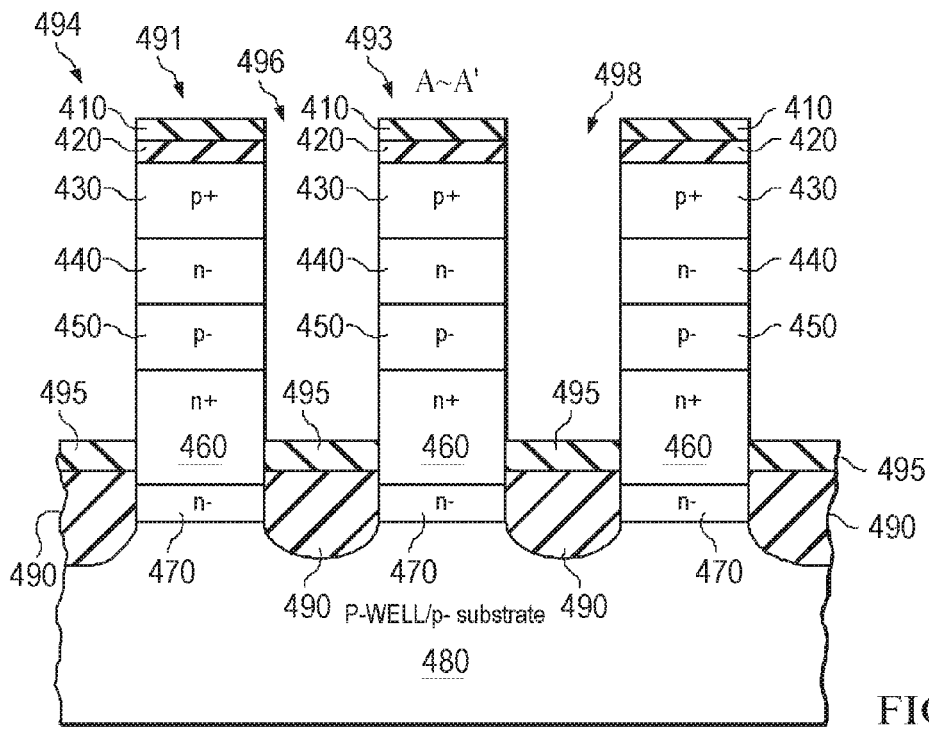
Figure 6B:
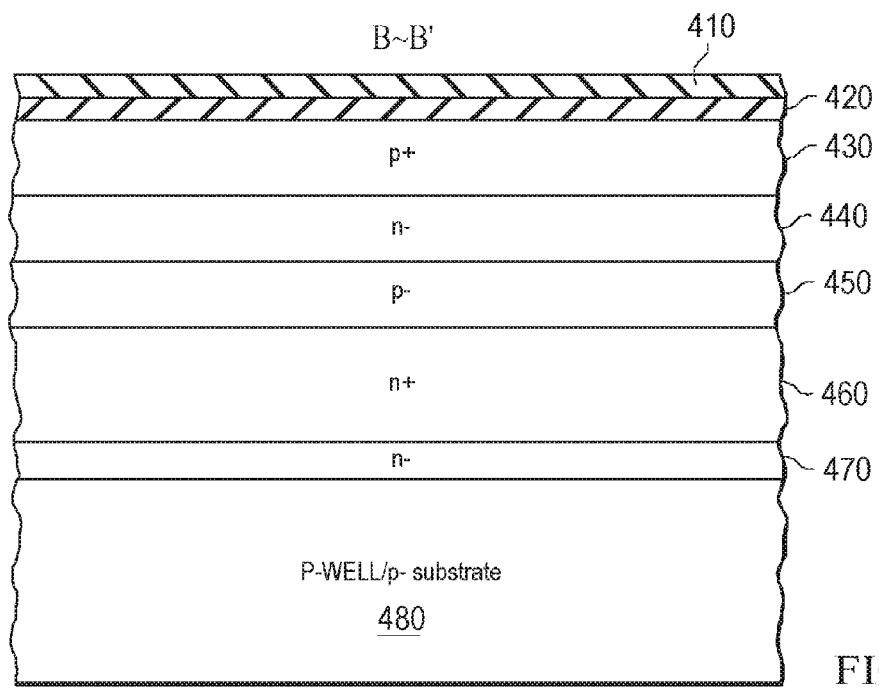

FIGS. 6A and 6B illustrate cross-sectional views of the structure of FIGS. 5A and 5B after a sacrificial material has been deposited and etched back to form sacrificial layer 495. In some embodiments, the sacrificial layer 495 may have a different etch rate from that of nitride layer 410 under the same etching chemical such that the sacrificial layer 495 may etch at a faster rate than nitride layer 410. The sacrificial layer 495 may be composed of carbon, silicon dioxide, amorphous silicon, any other suitable sacrificial material, or any combination thereof. In some embodiments, after etchback, the remaining sacrificial layer 495 resides only in the plurality of trenches (494, 496, 498). In some implementations, the remaining sacrificial layer 495 in the silicon trenches has a thickness of 5 nm~20 nm. In order to avoid formation of spacers along the sidewalls of the trenches, an anisotropic or non-conformal deposition method may be used to deposit the sacrificial layer 495.

Figure 7A:
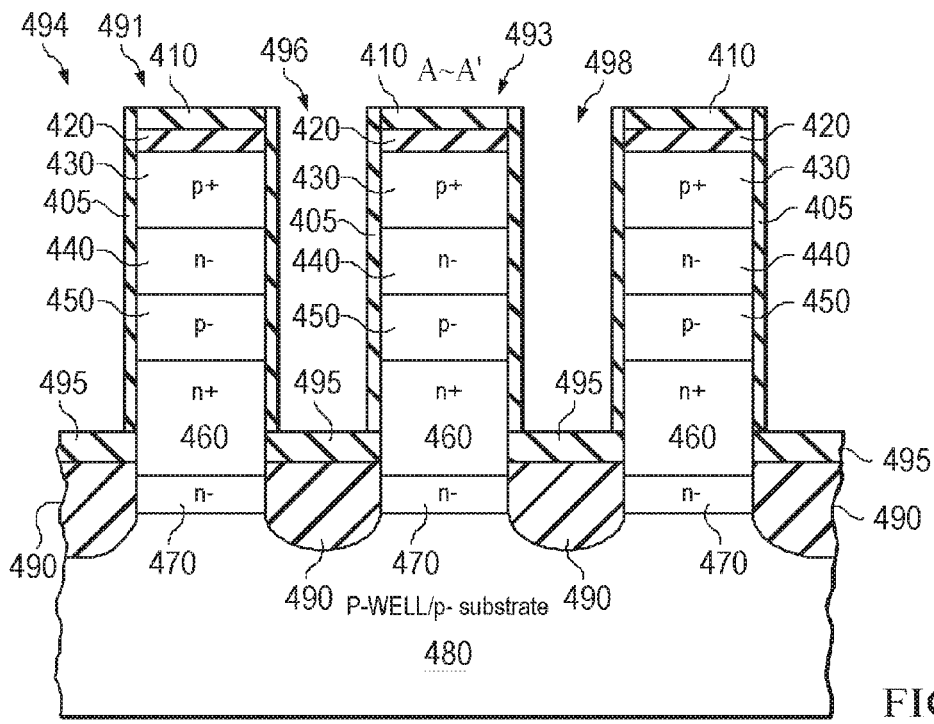
Figure 7B:
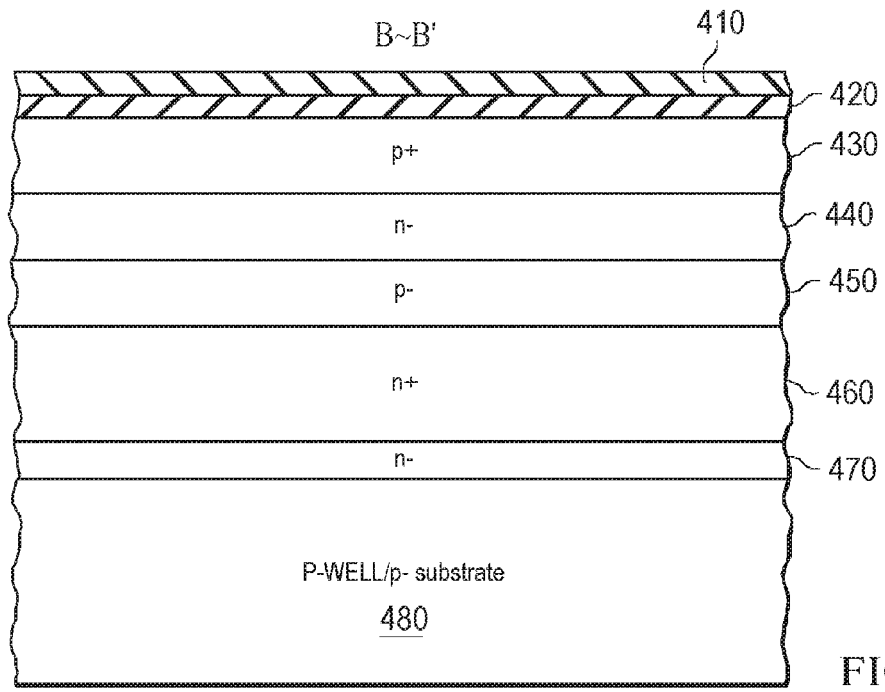

FIGS. 7A and 7B illustrate cross-sectional views of the structure of FIGS. 6A and 6B after formation of spacers 405 along the sidewalls of the plurality of trenches (494, 496, 498). Spacers 405 may be formed from an insulating material (e.g., silicon nitride, silicon dioxide, any other suitable insulating material or any combination thereof). To form the spacers, a layer of insulating material may be deposited using an isotropic or conformal deposition method. Alternatively to, or in addition before depositing the layer of insulating material, a layer of silicon dioxide may be formed by thermal oxidation of silicon of the plurality of semiconductor stacks (493, 495). The layer of insulating material may be etched using an anisoptropic etch to form spacers 405 along the sidewalls of the plurality of semiconductor stacks (493, 495).

Figure 8A:
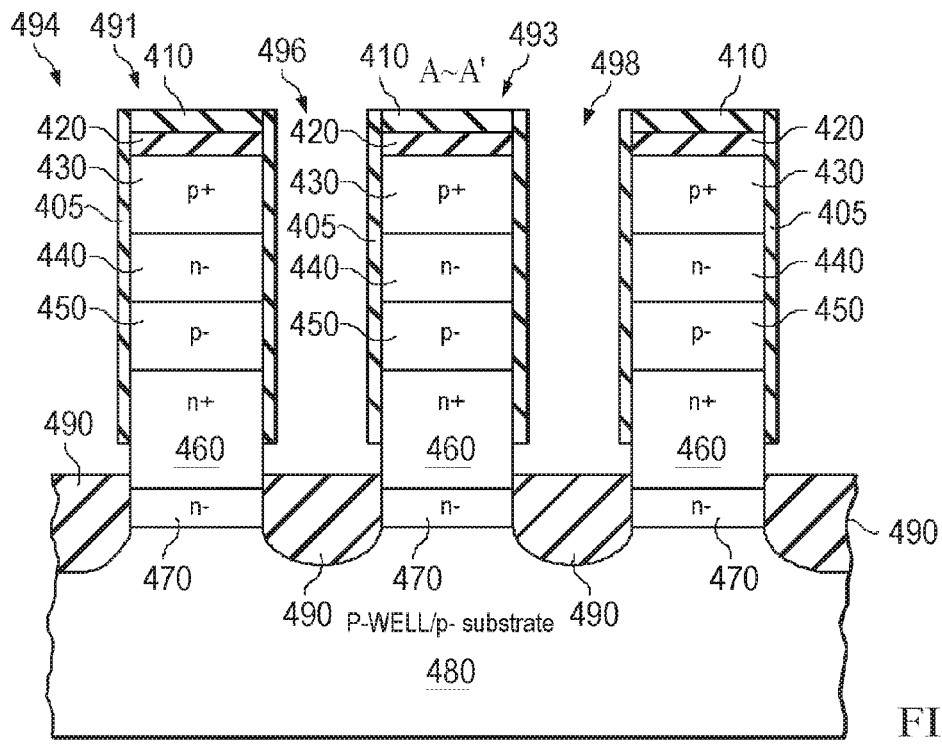
Figure 8B:
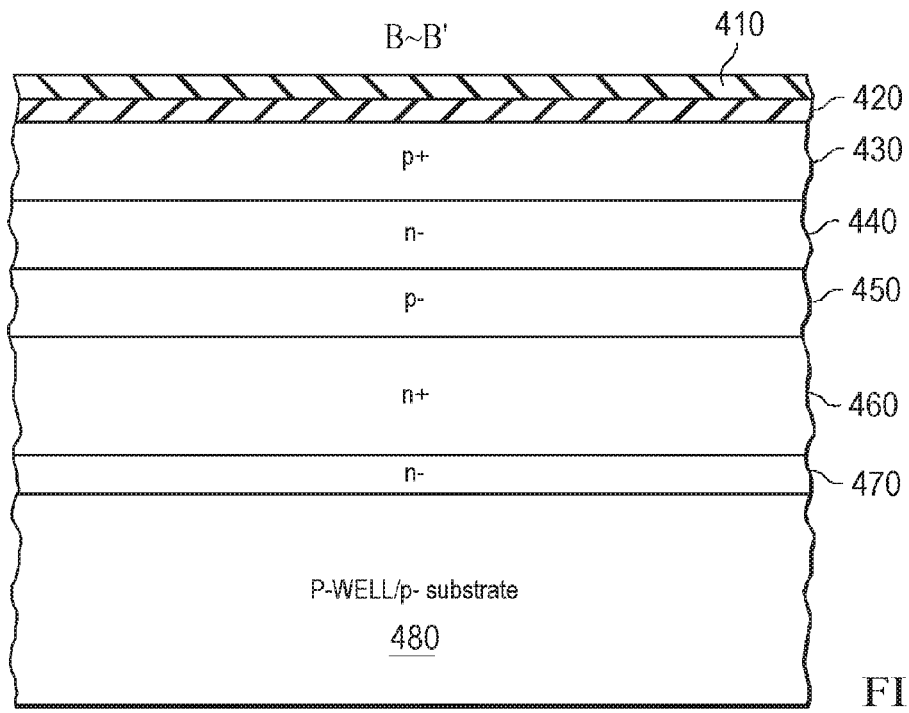

FIGS. 8A and 8B illustrate cross-sectional views of the structure of FIGS. 7A and 7B after the sacrificial layer 495 has been selectively removed (e.g., by dry etching or wet etching) to expose a portion of semiconductor sidewall near the trench bottom below spacers 405. The portion of semiconductor sidewall may be portions of the n+ layer 460 of the plurality of semiconductor stacks (493, 495). For example, spacers 405 may be composed of silicon oxide, sacrificial layer 495 may be composed of silicon nitride, and insulator 490 may be silicon oxide. The sacrificial layer 495 composed of silicon nitride may be selectively etched by a process (e.g., a wet etch using phosphoric acid ($H_3PO_4$) or a dry etch that uses a high concentration of nitrogen ($N_2$) relative to $CHF_3$, greater than 80% content) that etches silicon nitride at a faster rate than silicon oxide. For example, spacers 405 may be composed of silicon nitride, sacrificial layer 495 may be composed of silicon dioxide and insulator 490 may be silicon nitride. The sacrificial layer 495 composed of silicon oxide may be selectively etched by a process (e.g., a dry etch that uses a low concentration of nitrogen ($N_2$) relative to $CHF_3$ such as less than 50% content). Examples of selective dry etch chemistries are discussed in Li, Y. X., P. J. French, and R. F. Wolffenbuttel. "Selective reactive ion etching of silicon nitride over silicon using CHF3 with N2 addition." *Journal of Vacuum Science & Technology* B 13.5 (1995): 2008-2012.

Figure 9A:
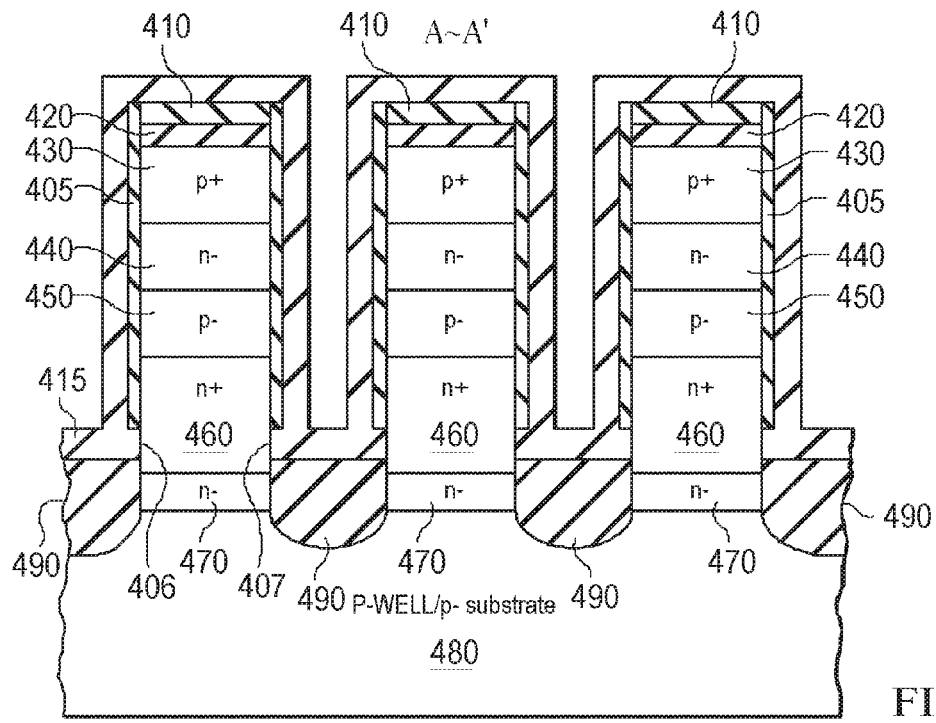
Figure 9B:
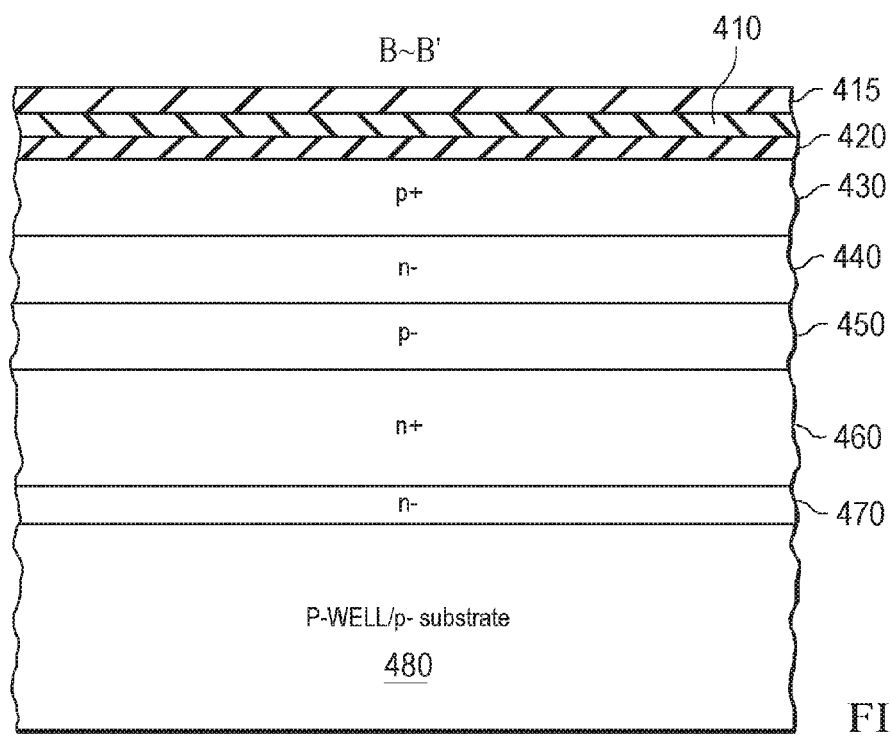

FIGS. 9A and 9B illustrate cross-sectional views of the structure of FIGS. 8A and 8B after a metal film 415 has been deposited over the entire wafer surface to a predetermined thickness. The metal film 415 may be deposited using physical vapor deposition (PVD), chemical vapor deposition (CVD), or atomic layer deposition (ALD). The metal film 415 may also be formed at the bottom of trenches (not shown) instead of a conformal film by deposition and etch-back to reduce possible reaction of the metal in areas other than the bottom of the trenches. In some embodiments, the metal can be a refractory metal and/or transition metal that forms a stable alloy with silicon. For example, the stable alloy may be a metal silicide. The metal is chosen such that metal atoms are the dominant diffusing species instead of silicon atoms during silicidation. The diffusion of metal atoms and silicon atoms during a silicidation process may be understood in the context of Fick's law:

$$J=-D^*\Delta C \quad (EQ. 2)$$

where J is the flux of a diffusing species (e.g., metal atoms in silicon or silicon atoms in metal), D is the diffusivity of the diffusing species, and $\Delta C$ is the concentration gradient of the diffusing species. As referred to herein, the term "dominant diffusing species" shall be understood to refer to a first material that has a higher flux of diffusion ($J_1$) into a second material, than a flux of diffusion ($J_2$) of the second material into the first material at a given process temperature and interface between the first material and the second material. For example, cobalt atoms have a higher diffusion flux into silicon than do silicon atoms into cobalt at an interface between silicon and cobalt at certain process temperatures.

The higher flux ($J_{12}$) of diffusion of the first material in the second material than a flux ($J_{21}$) of the second material in the first may be caused by a higher diffusivity ($D_{12}$) of the first material in the second material than a diffusivity ($D_{21}$) of the second material in the first material, and/or may be caused by a greater concentration gradient ($\Delta C_{12}$) of the first material within the second material than a concentration gradient ($\Delta C_{12}$) of the second material within the first material. The concentration gradient of the first material within the second material ($\Delta C_{12}$) may be influenced by the concentration of the first material at the interface between the first material and second material ($Co_{12}$) and by solid solubility of the first material within the second material ($Cs_{12}$). For example, the concentration of the first material at the interface may depend on the density of the first material, which in turn may depend on crystallinity of the first material and a lattice constant of the first material. Single crystalline films tend to have a higher density than polycrystalline films which tend to have a higher density than amorphous films. Additionally, materials having a smaller lattice constant tend to have a higher density than materials having a larger lattice constant. Accordingly, crystalline materials having smaller lattice constants may have a higher concentration at an interface than amorphous materials having larger lattice constants. The concentration of the first material within the second material ($Ci_{12}$), at the interface between the first material and second material, may be limited by the solid solubility ($Cs_{12}$) of the first material within the second material. Accordingly, although the first material may have a higher density, and therefore higher concentration than the second material at the interface, the concentration ($Ci_{12}$) of the first material within the second material at the interface may be lower if the solid solubility ($Cs_{12}$) of the first material is lower than the concentration ($Ci_{12}$).

Metals that are a dominant diffusing species during silicidation are selected because a greater percentage of silicide will form into the silicon, instead of into the metal. This formation of silicide into the silicon instead of the metal helps to fully form silicide through a portion (e.g., n+ layer 460) of a semiconductor stack (e.g., 491) that forms a thyristor, as discussed further below in reference to FIGS. 10A and 10B. Additionally, formation of the silicide preferentially into the silicon instead of the metal may reduce void formation in the silicon. In some embodiments, the metal may be a transition metal from any one of a Group 9 metal or a Group 10 metal from the periodic table of elements. Group 9 metals include cobalt. Group 10 metals include nickel, platinum, and palladium. These metals tends to be the dominant diffusing species during a silicidation reaction, in contrast to Group 4 (e.g., titanium) and Group 5 metals (e.g., tantalum). In silicidation reactions of Group 4 and Group 5 metals, silicon tends be the dominant diffusing species.

Figure 10A:
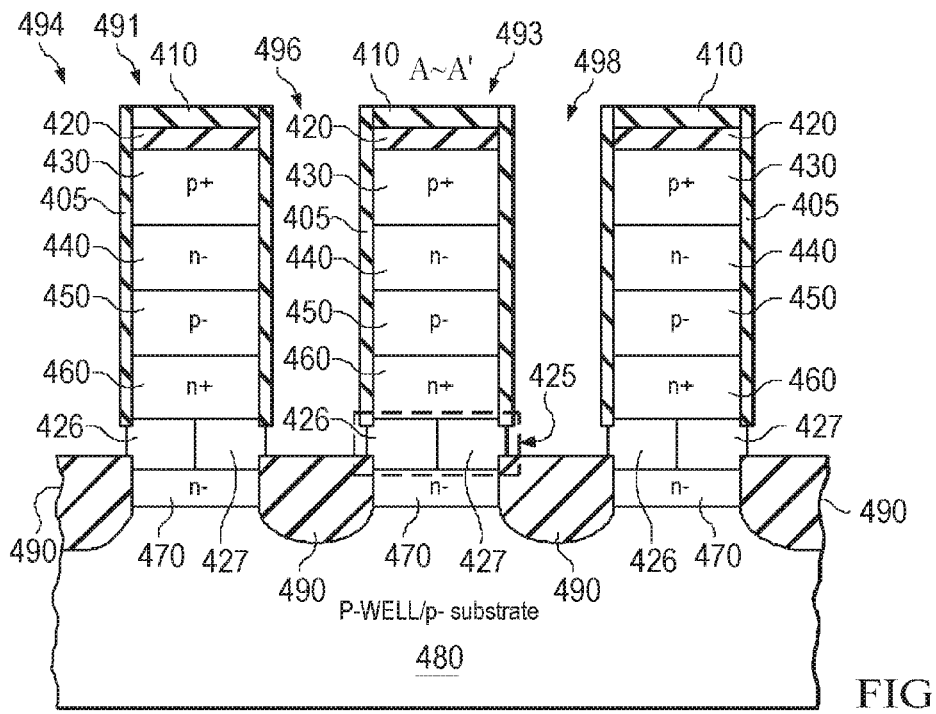
Figure 10B:
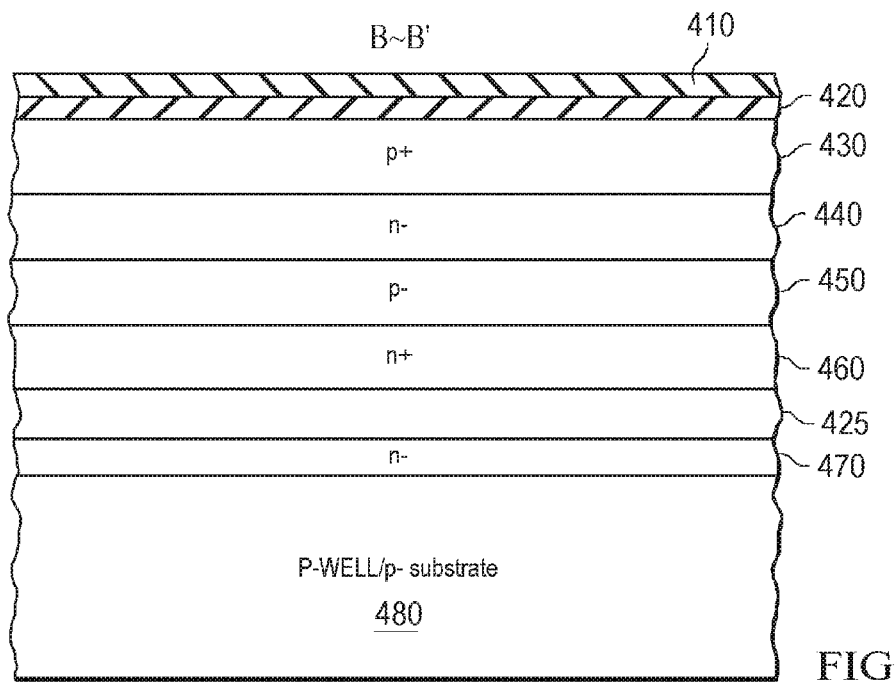

FIGS. 10A and 10B illustrate cross-sectional views of the structure of FIGS. 9A and 9B after a thermal annealing step is performed to form first a conductor region 425 through the silicon sidewall openings. In some embodiments, conductor region 425 may be composed of a metal silicide and/or may be a first metal silicide region. In some embodiments, the thermal annealing step is performed in a rapid thermal anneal (RTA) apparatus and may be done at two or more different temperatures. Since metal atoms are the dominant diffusing species during the silicidation process, metal silicide in conductor region 425 forms substantially into the n+ layer (460). In some embodiments, the metal silicide may form into the n− layer (470). In some embodiments, the deposited metal thickness and anneal time are designed so that the metal silicide in conductor region 425 completely merges together within the n+ layer 460, as shown in FIG. 10A (along the direction labeled A-A'), and as shown as a continuous line of silicide in FIG. 10B (along the direction labeled B-B'). For example, the metal 415 (illustrated in FIGS. 9A and 9B) and silicon may be reacted to form a second metal silicide region 426 and a third metal silicide region 427 until the second metal silicide region 426 and the third metal silicide region 427 merge to form the first metal silicide region in conductor region 425. Thereafter, un-reacted metal is removed by an etchant (e.g., wet etchant, dry etchant, any other suitable etchant, or any combination thereof) and a continuous conductor region 425 (e.g., formed of metal silicide or other suitable material) is formed under n+ layer 460 along each primary cathode line (e.g., primary cathode line 254 illustrated in FIG. 2). Conductor region 425 (e.g., formed of metal silicide or other suitable material) may correspond to any of primary cathode lines 254 and 255 in FIG. 2. Although the metal silicide in conductor region 425 is illustrated as fully penetrating a semiconductor stack (e.g., 493, 495) at the n+ layer 460 in FIGS. 10A and 10B, in some embodiments the metal silicide may partially penetrate the semiconductor stack (e.g., 493, 495) as second metal silicide region 426 and third metal silicide region 427 leaving a gap (not shown) between two metal silicide regions (e.g., 426, 427). It should be understood that the process of forming metal silicide discussed above may not result in stoichiometric metal silicide materials. However, non-stoichiometric metal silicide materials may still have the properties of low resistivity and low minority carrier lifetime to effectively cause minority carriers to recombine within the non-stoichiometric materials.

Figure 11A:
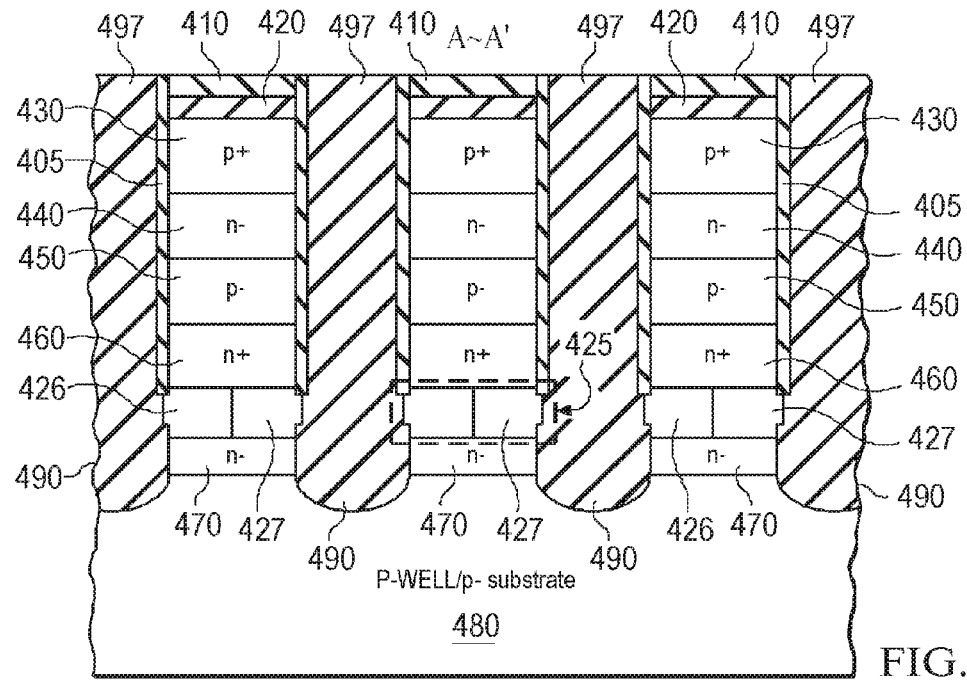
Figure 11B:
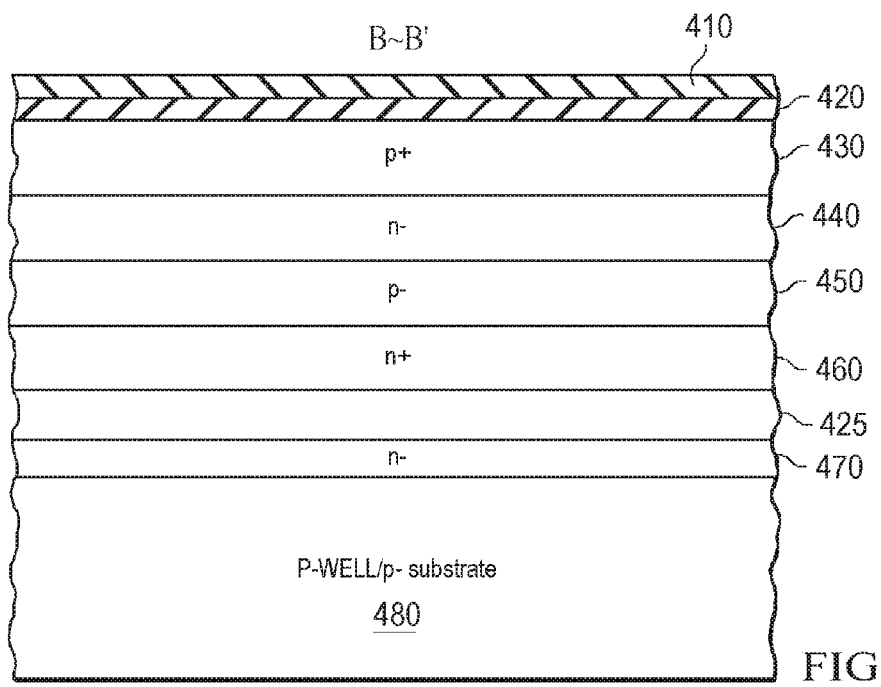

FIGS. 11A and 11B illustrate cross-sectional views of the structure of FIGS. 9A and 9B after deposition of an insulator (such as silicon oxide, silicon nitride, or any other suitable insulator) and planarization to fill in the plurality of trenches (e.g., trenches 494, 496, 498 of FIG. 10A) with the insulator to form isolation insulator regions 497. In some embodiments the isolation insulators may also be referred to as trench isolation, shallow trench isolation or trench oxides. Sidewall spacers 405 can be optionally removed before trench oxide fill. In some embodiments, sidewall spacers 405 (e.g., formed by thermal oxidation) may passivate interfacial traps at the interface between the spacer and the silicon, and may improve performance if not removed before trench oxide fill. In some embodiments, the insulator may be deposited by an isotropic or conformal deposition method. In some embodiments, the insulator may be deposited using an anisotropic or non-conformal deposition method. In some embodiments, the planarization is done by chemical-mechanical polishing (CMP). After polishing, the trench oxide is substantially level with the top surface of nitride 410.

Figure 12A:
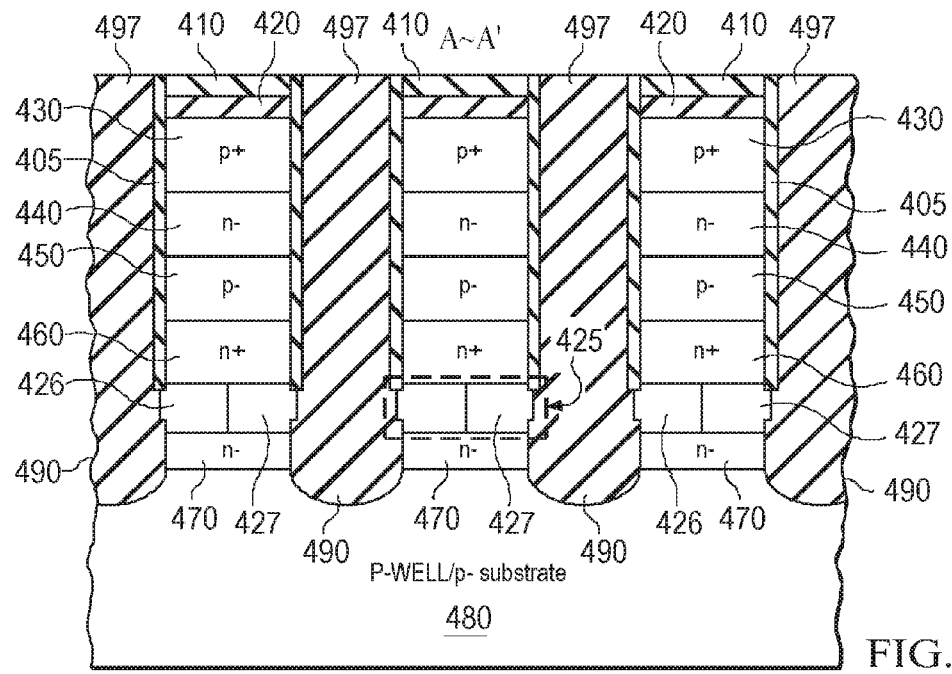
Figure 12B:
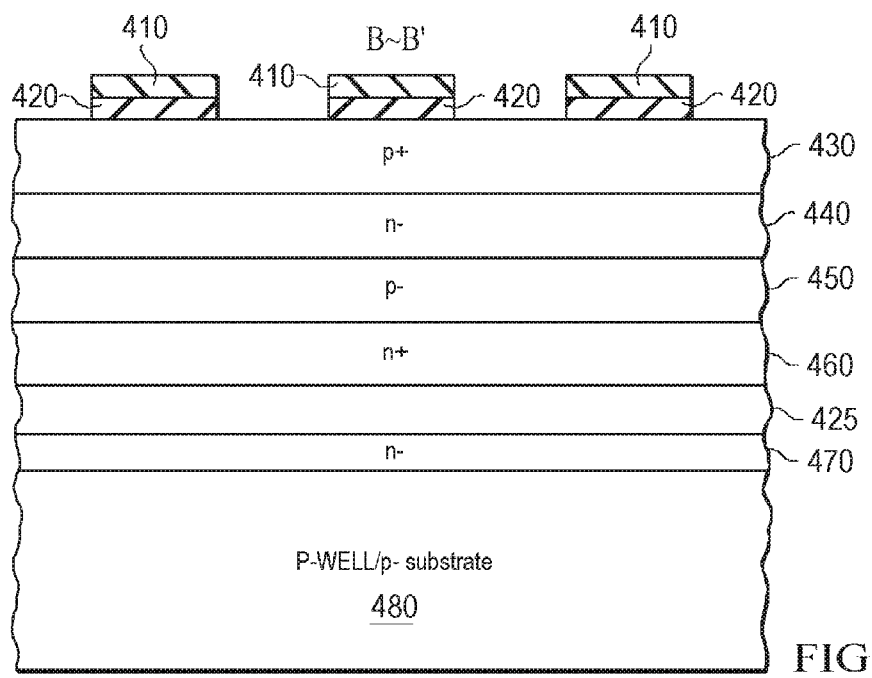

FIGS. 12A and 12B illustrate cross-sectional views of the structure of FIGS. 11A and 11B after a lithographic step is used to define a plurality of photoresist stripes along a direction of an anode line (e.g., at positions along the direction labeled B-B', where each of the photoresist stripes runs parallel to the direction labeled A-A' in FIGS. 2 and 12A) (not shown). After etching of nitride 410 and pad oxide 420 and photoresist removal, rectangular openings are formed as shown in FIG. 12B (e.g., at positions along the direction labeled B-B', where each rectangular opening runs parallel to the direction labeled A-A' in FIGS. 2 and 12A). In some embodiments, the rectangular openings may be bounded by isolation insulator regions 497 in one direction (e.g., along the direction labeled A-A' in FIG. 12A) and nitride in another direction (e.g., along the direction labeled B-B' in FIG. 12B).

Figure 13A:
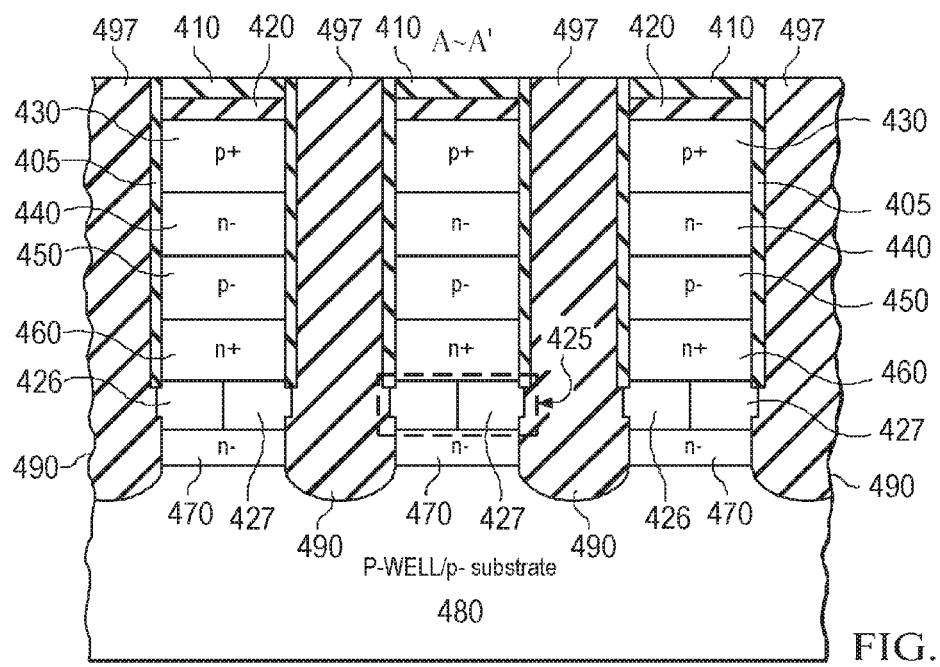
Figure 13B:
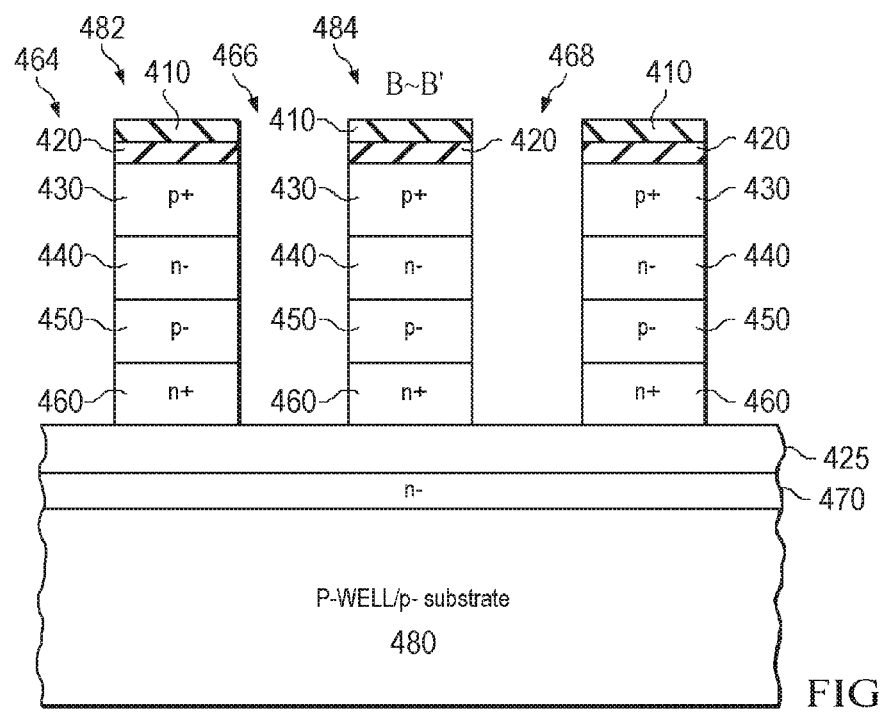

FIGS. 13A and 13B illustrate cross-sectional views of the structure of FIGS. 12A and 12B after a plurality of trenches (e.g., 464, 466, 468) are etched into exposed silicon regions using the nitride layer 410 and pad oxide layer 420 as a hard mask. The plurality of trenches (e.g., 464, 466, 468) are illustrated in FIG. 13B along a cathode line (e.g., at positions along the direction labeled B-B' where each trench is parallel to the direction labeled A-A' in FIGS. 2 and 13A). The plurality of trenches may separate a plurality of semiconductor stacks (e.g., 482, 484). In some embodiments, end-point detection is used such that the silicon etch stops at conductor region 425 (e.g., formed of metal silicide or other suitable material). In some embodiments, an anisotropic etch method such as reactive ion etching (RIE), may be used to etch the plurality of trenches (e.g., 464, 466, 468) in order to achieve a high aspect ratio of the plurality of trenches. For example, an aspect ratio of the plurality of trenches may be greater than 100. For example, an aspect ratio of the plurality of trenches may be greater than 70. For example, an aspect ration of the plurality of trenches may be greater than 50. For example, an aspect ratio may be greater than 40.

Figure 14A:
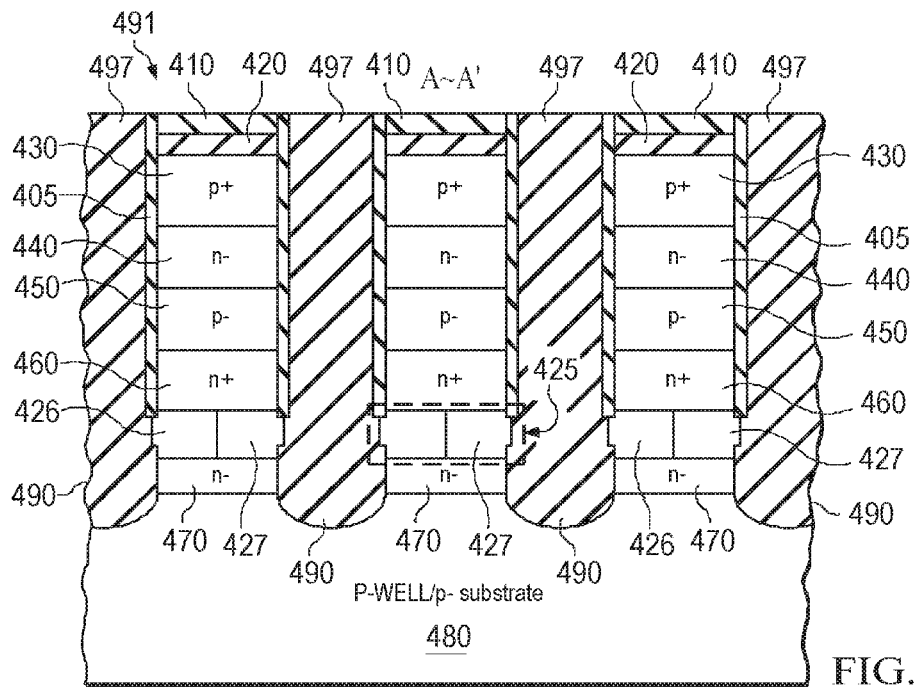
Figure 14B:
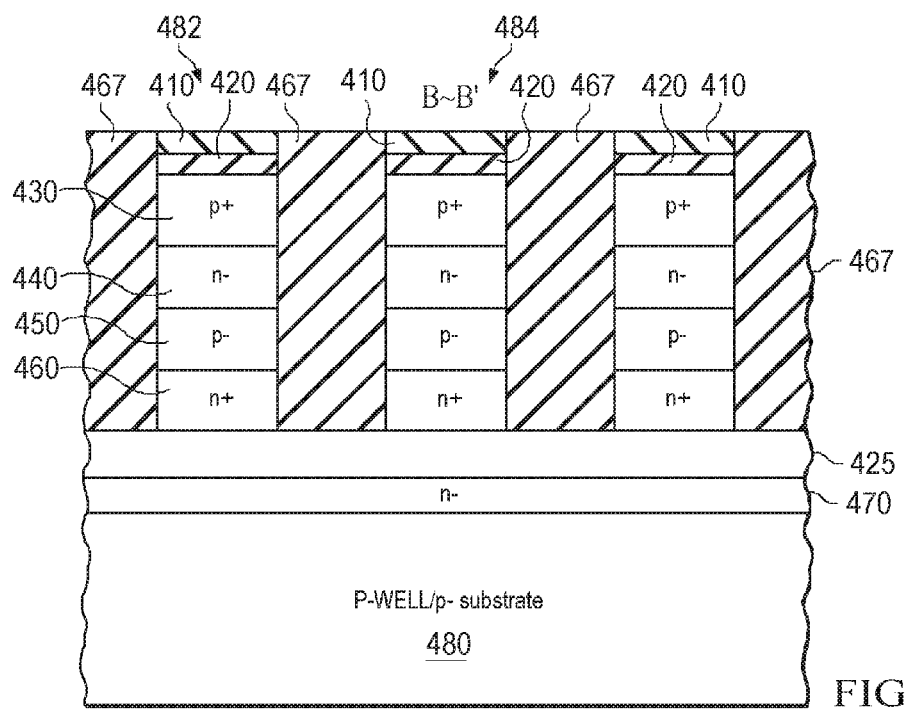

FIGS. 14A and 14B illustrate cross-sectional views of the structure of FIGS. 13A and 13B after deposition of an insulator (e.g., silicon oxide, or any other suitable insulator) to fill the plurality of trenches (e.g., 464, 466, 468) illustrated in FIG. 13B along the cathode line and planarization of the insulator to form isolation insulator regions 467. Optional etch-back can be performed to recess the insolation insulators (not shown).

Figure 15A:
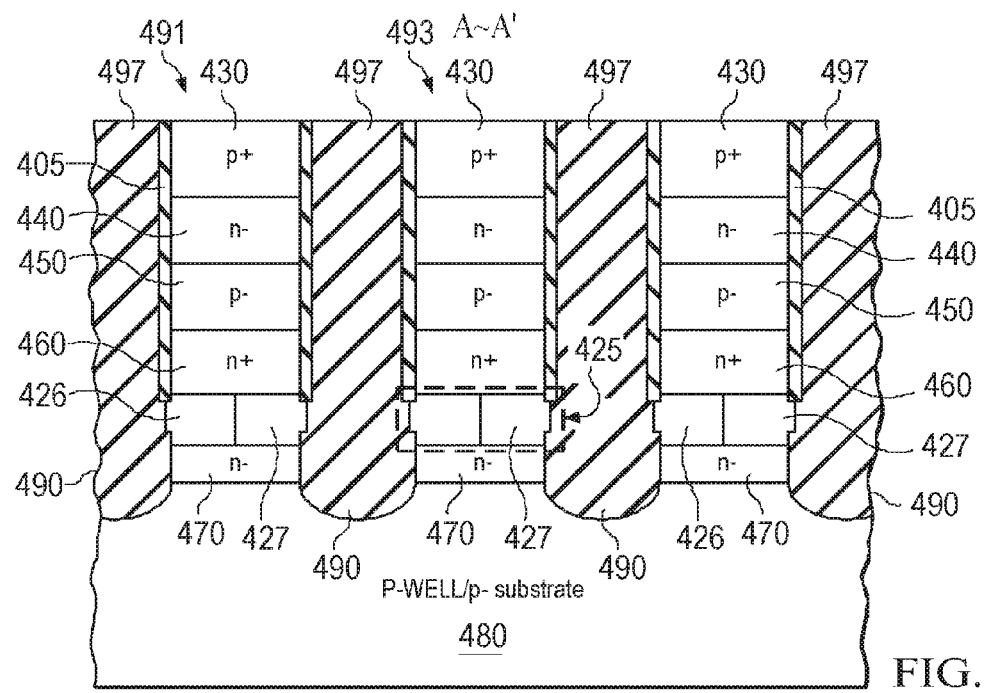
Figure 15B:
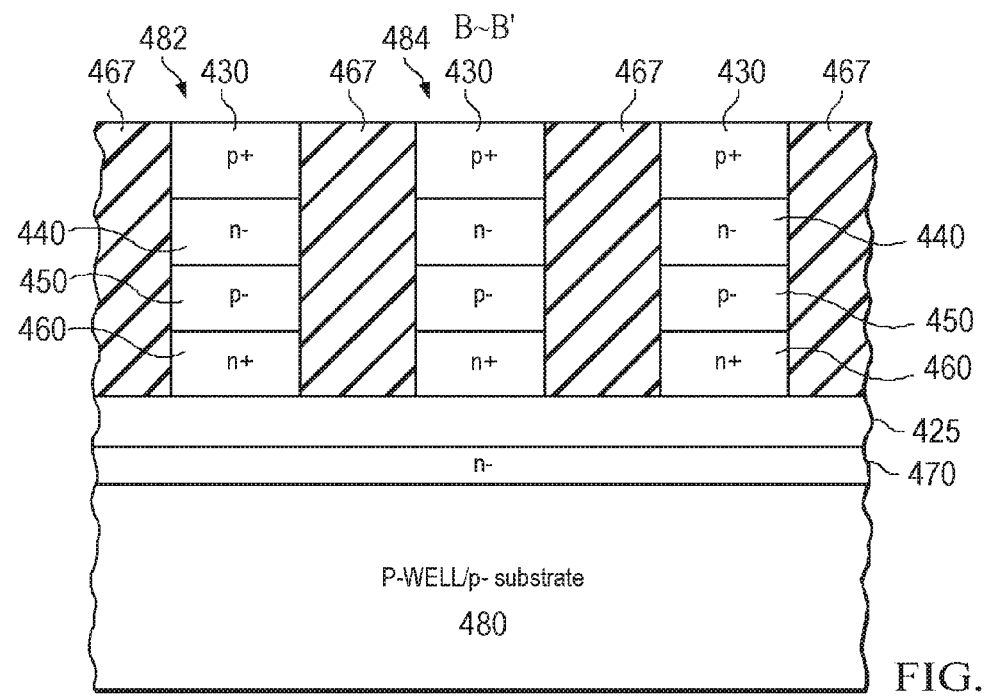

FIGS. 15A and 15B illustrate cross-sectional views of the structure of FIGS. 14A and 14B after nitride layer 410 and pad oxide layer 420 are removed (e.g., by wet etch, dry etch, CMP or any other suitable method for removal). The structure illustrated in FIGS. 15A and 15B is similar to the structure illustrated in FIG. 2 and FIG. 3. For example, a semiconductor stack 491 in FIG. 15A corresponds to thyristor 291 in FIG. 2, semiconductor stack 482 in FIG. 15B corresponds to thyristor 210 in FIG. 2 and first thyristor 310 in FIG. 3, semiconductor stack 484 corresponds to thyristor 220 in FIG. 2 and second thyristor 320 in FIG. 3. The conductor region 425 in FIGS. 15A and 15B corresponds to a primary cathode line 254 in FIG. 2, and primary cathode line 354 in FIG. 3. The n− layer 470 of FIG. 15B corresponds to the secondary cathode line 234 of FIG. 2 and secondary cathode line 334 of FIG. 3.

Figure 16:
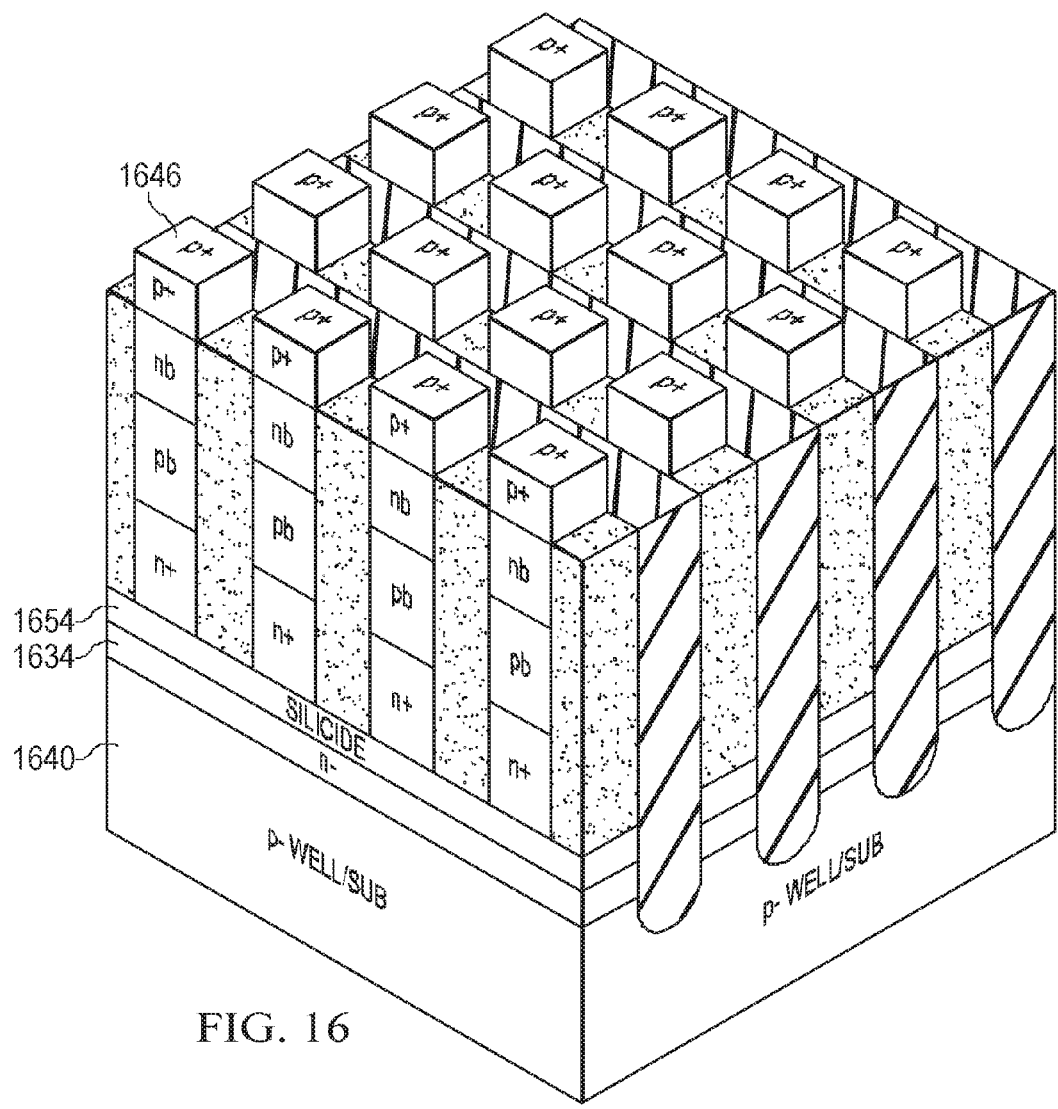
FIG. 16 illustrates a 4×4 cell array that includes an MCLK region in accordance with some embodiments of the present disclosure.

FIG. 16 illustrates a 4×4 cell array that includes an MCLK region in accordance with some embodiments of the present disclosure. The starting layers of the structure of FIG. 16 are similar to the structure illustrated in FIGS. 2, 4A-15B and 4B-15B except that p+ layer 430 is not initially included. Primary cathode line 1634 in FIG. 16 corresponds to primary cathode line 254 in FIG. 2 and conductor region 425 in FIGS. 10A-15A and 10B-15B. Secondary cathode line 1634 in FIG. 16 corresponds to secondary cathode line 234 in FIG. 2 and n– layer 470 in FIGS. 10A-15A and 10B-15B. Substrate 1640 in FIG. 16 corresponds to substrate 240 in FIG. 2 and substrate 480 in FIGS. 4A-15A and 4B-15B. The island regions (e.g., island region 1646) are grown after trench formation (e.g., after the steps illustrated in FIGS. 15A and 15B). The island regions (e.g., island region 1646) may be grown by selective epitaxy with in-situ doping to form single crystalline p+ islands of silicon. This process of forming the p+ islands after trench formation permits formation of shallower trenches, avoiding issues associated with deep trench formation such as ballooning during etch, keyholes during filling of the deep trench, and mechanical instability, as discussed previously. In some embodiments, the p+ islands may be grown by selective epitaxy at a temperature between 800 C-900 C, or below said temperatures, in order to reduce dopant redistribution effects in previously formed layers (e.g., n– layer 440, p– layer 450, n+ layer 460, or any other previously formed doped layer).

Similar to the approach used to form the array illustrated in FIG. 16, in some embodiments the starting layers to form a pnpn structure may include n–/n+/p– layers (not shown). For example, the starting layers may be similar to the layers illustrated in FIGS. 4A and 4B except that p+ layer 430 and n– layer 440 are not included. Both n– layer 440 and p+ layer 430 may be grown after trench formation by selective epitaxy with in-situ doping.

Second Type

Another solution to reduce disturb effects between thyristor cells is to create a minority carrier barrier inside the cathode such that it blocks minority carriers (e.g., holes inside an n+ cathode or cathode line) from diffusing into OFF cells. For cell performance considerations, it is also desirable that the introduced barrier does not significantly increase the cathode resistance and does not affect thyristor switching characteristics. An embodiment, therefore, is to embed inside a cathode or cathode line another material that has a narrower bandgap ($E_g$) than the material constituting the cathode (e.g., silicon, compound semiconductors or any other suitable semiconductor) but also an electron affinity that is substantially the same as that of the material constituting the cathode. For example, two materials having respective electron affinities that differ by less than 50 millielectron volts (meV) may be considered to have electron affinities that are substantially the same. In the case of a pnpn structure with an n+ cathode, where the minority carriers are holes, the $E_g$ difference should come from a valence band offset ($\Delta E_v$) to form a potential barrier for the minority carrier holes. In the case of an npnp structure with a p+ cathode, where the minority carriers are electrons, the $E_g$ difference should come from a conduction band offset ($\Delta E_c$) to form a potential barrier for minority carrier electrons. As a non-limiting example, strained Silicon Germanium (SiGe) may satisfy the requirements to form a barrier in a pnpn structure for minority carrier holes in an n+ cathode.

Figure 17:
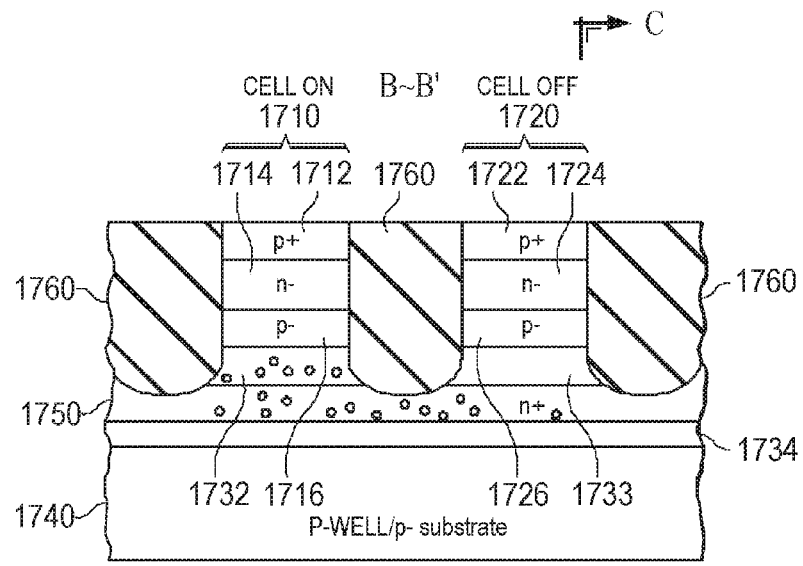
FIG. 17 illustrates a cross-sectional view of a cell array that includes a minority carrier potential well formed in the cathode in accordance with some embodiments of the present disclosure.

FIG. 17 illustrates a cross-sectional view of a cell array that includes a minority carrier potential well formed in the cathode in accordance with some embodiments of the present disclosure. The cross-sectional view illustrated in FIG. 17 is similar to the cross-sectional view illustrated in FIG. 1, except that the cathode 130 of FIG. 1 is divided into a first cathode 1732 that is part of first thyristor 1710, a second cathode 1733 that is part of second thyristor 1720, a first cathode line 1750 that acts as a potential well region for minority carriers from first cathode 1732 and second cathode 1733, and a second cathode line 1734. Substrate 1740 of FIG. 17 corresponds to substrate 140 of FIG. 1. Isolation insulator region 1760 of FIG. 17 corresponds to isolation insulator region 160 in FIG. 1.

A first semiconductor layer 1712 (e.g., a p+ anode) of first thyristor 1710 in FIG. 17 corresponds to first semiconductor layer 112 of first thyristor 110 in FIG. 1. A second semiconductor layer 1714 (e.g., an n– base) of first thyristor 1710 in FIG. 17 corresponds to second semiconductor layer 114 of first thyristor 110 in FIG. 1. A third semiconductor layer 1716 (e.g., a p– base) of first thyristor 1710 in FIG. 17 corresponds to third layer 116 of first thyristor 110 in FIG. 1. A first semiconductor layer 1722 (e.g., a p+ anode) of second thyristor 1720 in FIG. 17 corresponds to first semiconductor layer 122 of second thyristor 120 in FIG. 1. A second semiconductor layer 1724 (e.g., an n– base) of second thyristor 1720 in FIG. 17 corresponds to second semiconductor layer 124 of second thyristor 120 in FIG. 1. A third semiconductor layer 1726 (e.g., a p– base) of second thyristor 1720 in FIG. 17 corresponds to third semiconductor layer 126 of second thyristor 120 in FIG. 1.

In some embodiments, the potential well region of the first cathode line 1750 may be a thin layer of a compound semiconductor inside the cathode. For example, the potential well region of the first cathode line 1750 may be a thin layer of $Si_{1-x}Ge_x$ inside an n+ silicon cathode (e.g., between first cathode 1732 and second cathode line 1734 and between second cathode 1733 and second cathode line 1734), such that minority holes collected in the potential well region of the first cathode line 1750 cannot easily diffuse into a neighboring OFF cell (e.g., second thyristor 1720). In the term $Si_{1-x}Ge_x$, x represents a mole fraction of Ge content within an SiGe region forming the potential well region. The valence band offset ($\Delta E_v$) is a function of Ge content of the potential well region. In some embodiments, a $\Delta E_v > 100$ meV (milli-electron volts), resulting from a Ge mole fraction greater than or equal to 10% may be preferred. In some embodiments, a Ge mole fraction less than or equal to 50% may be preferred. Minority carrier holes may be confined to the potential well region of the first cathode line 1750 where they recombine or drift out to a drain at a cathode pickup (not shown). In some embodiments, the potential well region and first cathode line 1750 may have a thickness between 20 nanometers and 300 nanometers or a thickness between 50 nanometers and 300 nanometers.

Figure 18:
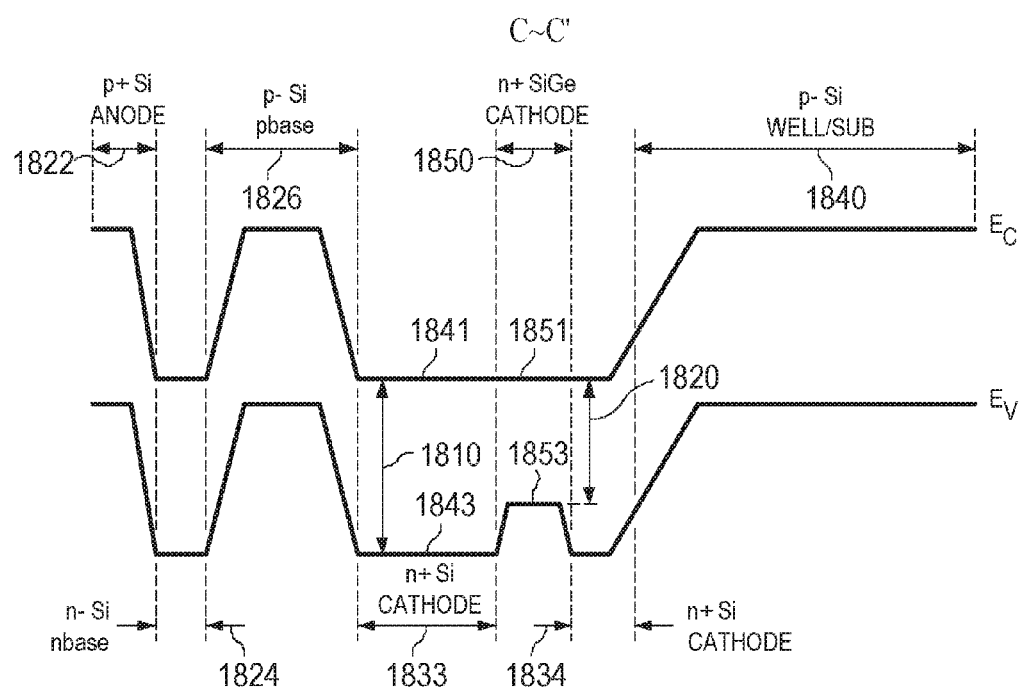
FIG. 18 illustrates an energy band diagram for the cell array in FIG. 17, in accordance with some embodiments of the present disclosure.

FIG. 18 illustrates an energy band diagram for the cell array in FIG. 17, in accordance with some embodiments of the present disclosure. The band diagram of FIG. 18 corresponds to the cross-sectional direction labeled C-C' in FIG. 17. The band diagram includes a p+ anode region 1822 corresponding to first semiconductor layer 1722 in FIG. 17, n– base region 1824 corresponding to second semiconductor layer 1724 in FIG. 17, p– base region 1826 corresponding to third semiconductor layer 1726 in FIG. 17, n+ cathode region 1833 corresponding to the second cathode 1733 in FIG. 17, n+ SiGe cathode region 1850 corresponding to first cathode line 1750 in FIG. 17, n+ cathode region 1834 corresponding to second cathode line 1734 in FIG. 17, and p– Si region 1840 corresponding to substrate 1740 in FIG. 17. FIG. 18 illustrates a hole potential well in region 1850 inside an n+ silicon cathode region from a thin layer of silicon germanium alloy. The n+ doped cathode region may collectively refer to the Si/SiGe/Si heterostructure corresponding to regions 1833, 1850 and 1834.

A conduction band edge discontinuity ($\Delta E_c$) is between regions 1833 and 1850 and between 1850 and 1834 is less than 50 meV and neglected. For example, the conduction band edge of region 1833 corresponds to a first electron affinity 1841 and the conduction band edge of region 1850 corresponds to a second electron affinity 1851. The electron affinities of regions 1822, 1824, 1826, 1834 and 1840 may all be the same as the first electron affinity 1841. For example, if regions 1822, 1824, 1826, 1833, 1834 and 1840 are composed of silicon, said regions may have an electron affinity near 4.05 eV. The second electron affinity 1851 of region 1850 may be substantially the same as the first electron affinity 1841. For example, region 1850 may be a silicon germanium compound having a second electron affinity 1851 that differs by 50 meV or less from the 4.05 eV first electron affinity of silicon. Because the first electron affinity 1841 and the second electron affinity 1851 are substantially the same, the well depth of the hole potential well results from a difference between the first valence band edge 1843 of region 1833 and the second valence band edge 1853 of region 1850. The well depth may be calculated as the difference between a first bandgap 1810 of region 1833 and a second bandgap 1820 of region 1834. For example, region 1833 may be silicon, and the first bandgap 1810 may be about 1.1 eV. For example, region 1850 may be a silicon germanium compound having a bandgap of approximately 1 eV at a composition of $Si_{0.9}Ge_{0.1}$, where the mole fraction of germanium is 10%. The first bandgap 1810 may be calculated as the difference between first electron affinity 1841 and the first valence band edge 1843, and the second bandgap 1820 may be measured as the difference between second electron affinity 1851 and the second valence band edge 1853. The well depth for holes in the valence band can range from 100 meV to 400 meV and can be adjusted by Ge content of the SiGe region 1850. The hole potential well collects minority holes from ON cells and prevents them from diffusing into OFF cells.

In some embodiments related to the structure illustrated in FIG. 18, a deeper well>=~300 meV (e.g., formed by using a larger Ge content) or a longer well (e.g., formed by a thicker SiGe layer) may be used to increase the number of minority holes that can be stored and recombined in the hole potential well in region 1850. In some embodiments, a drain for minority holes can be provided such that a hole barrier to the drain is lower than that to the neighboring cells. In some embodiments, the drain may be designed to have a contact that is Ohmic to both electron and holes. This drain (not shown) can be made by a SiGe or metal plug contact to the potential well in region 1850 (e.g., composed of SiGe). In some embodiments, the potential well in the n+ cathode formed by the Si/SiGe/Si heterostructure corresponding to regions 1833, 1850 and 1834 eliminates the parasitic BJT formed with the substrate (e.g., between p– region 126, n+ region 130, and p– substrate 140 in FIG. 1) and the parasitic BJT formed between first thyristor 110 and second thyristor 120 (e.g., between p– region 116, n+ region 130 and p– region 126 in FIG. 1). Because the parasitic BJTs are eliminated, parasitic currents associated with the parasitic BJTs are eliminated as well. Accordingly, read operations may be performed by measuring current from a cathode line, in addition to or as an alternative to the anode line (not shown).

Figure 19:
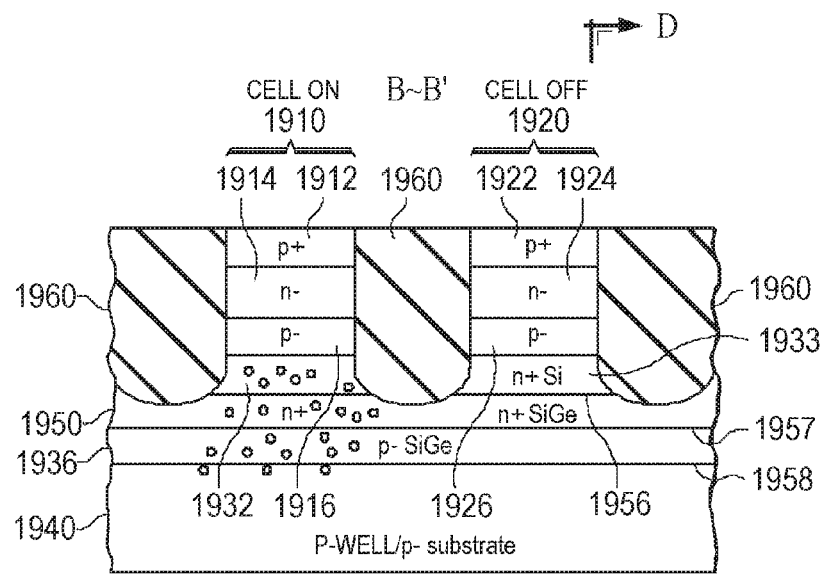
FIG. 19 illustrates a cross-sectional view of a cell array that includes a potential barrier formed in the cathode in accordance with some embodiments of the present disclosure.

FIG. 19 illustrates a cross-sectional view of a cell array that includes a potential barrier formed in a cathode in accordance with some embodiments of the present disclosure. The cross-sectional view illustrated in FIG. 19 is similar to the cross-sectional view illustrated in FIGS. 1 and 17, except the cathode 130 of FIG. 1 is divided into a first cathode 1932 that is part of first thyristor 1910, a second cathode 1933 that is part of second thyristor 1920, a first cathode line 1950 that acts as a potential well region for minority carriers within the cathode, and a second cathode line 1936. Substrate 1940 of FIG. 19 corresponds to substrate 140 of FIG. 1. Isolation insulator region 1960 of FIG. 19 corresponds to isolation insulator region 160 in FIG. 1. A first semiconductor layer 1912 (e.g., a p+ anode) of first thyristor 1910 in FIG. 19 corresponds to first semiconductor layer 112 of first thyristor 110 in FIG. 1. A second semiconductor layer 1914 (e.g., an n– base) of first thyristor 1910 in FIG. 19 corresponds to second semiconductor layer 114 of first thyristor 110 in FIG. 1. A third semiconductor layer 1916 (e.g., a p– base) of first thyristor 1910 in FIG. 19 corresponds to third layer 116 of first thyristor 110 in FIG. 1. A first semiconductor layer 1922 (e.g., a p+ anode) of second thyristor 1920 in FIG. 19 corresponds to first semiconductor layer 122 of second thyristor 120 in FIG. 1. A second semiconductor layer 1924 (e.g., an n– base) of second thyristor 1920 in FIG. 19 corresponds to second semiconductor layer 124 of second thyristor 120 in FIG. 1. A third semiconductor layer 1926 (e.g., a p– base) of second thyristor 1920 in FIG. 19 corresponds to third semiconductor layer 126 of second thyristor 120 in FIG. 1.

In some embodiments, a drain of minority holes to the substrate 1940 (e.g., p– well/p– substrate) by using a second cathode line 1936 (e.g., formed from p-type doped SiGe) underneath the first cathode line 1950 (e.g., an n+ SiGe region). The cathode (e.g., second cathode 1933, first cathode line 1950, and second cathode line 1936) may include a barrier to minority carriers at an interface 1956 (e.g., an Si/SiGe heterojunction) between second cathode 1933 (e.g., formed from n+ silicon) and first cathode line 1950 (e.g., from n+ silicon germanium). The cathode (e.g., second cathode 1933, first cathode line 1950, and second cathode line 1936) may include a first interface 1957 (e.g., a heterojunction between two regions of silicon germanium having different compositions) between first cathode line 1950 (e.g., from n+ silicon germanium) and second cathode line 1936 (e.g., formed from p– silicon germanium having a variable composition) that does not have a barrier to minority carriers (e.g., holes) to the substrate 1940. The cathode (e.g., second cathode 1933, first cathode line 1950, and second cathode line 1936) may include a second interface 1958 (e.g., an SiGe/Si heterojunction) between second cathode line 1936 (e.g., formed from p– silicon germanium having a variable composition) and the substrate 1940 that does not have a barrier to minority carriers (e.g., holes) to the substrate 1940. The second cathode line 1936 (e.g., formed from p– SiGe) serves two purposes. A first purpose is to lower the barrier (e.g., for holes) to substrate 1940 and a second is to provide a buffer layer (e.g., such that a strained n+ SiGe in the first cathode line 1950 can be grown more readily on top of the second cathode line). In some embodiments, the second cathode line 1936 is a p– SiGe buffer layer and has a variable composition of graded Ge content, varying from ~0% Ge at the second interface (e.g., a p– SiGe/p– Si substrate interface) to 20%~50% Ge at the second interface 1957 (e.g., a n+ SiGe/p– SiGe interface).

Figure 20:
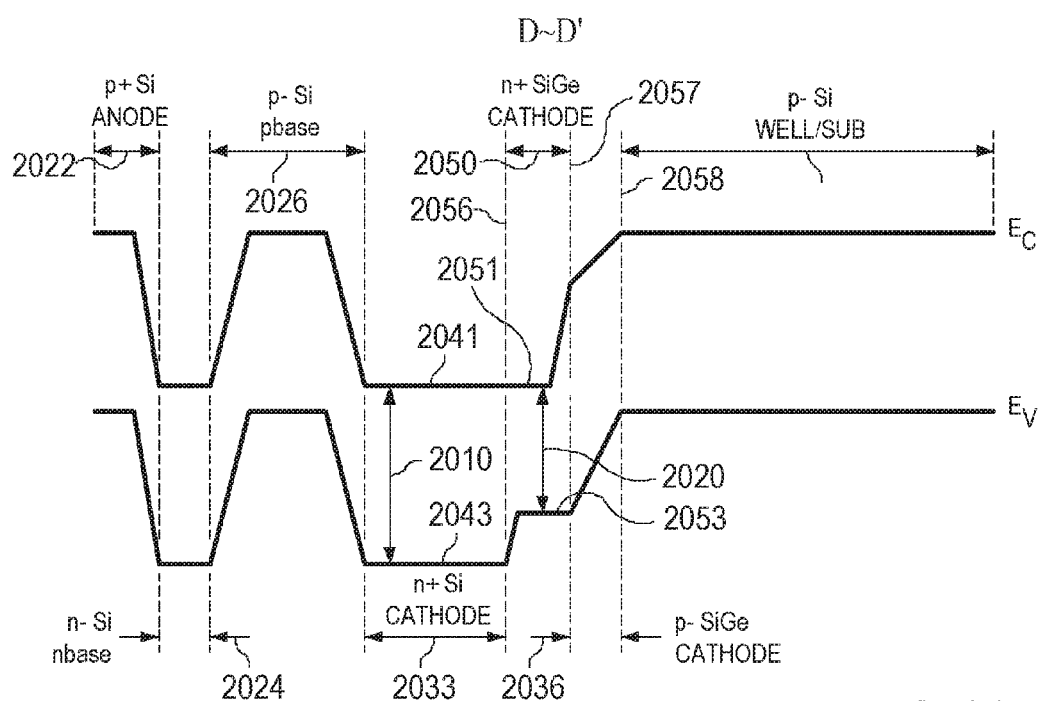
FIG. 20 illustrates an energy band diagram for the cell array in FIG. 19, in accordance with some embodiments of the present disclosure.

FIG. 20 illustrates an energy band diagram for the cell array in FIG. 19, in accordance with some embodiments of the present disclosure. The band diagram of FIG. 20 corresponds to the cross-sectional direction labeled D-D' in FIG. 19. The band diagram includes a p+ anode region 2022 corresponding to first semiconductor layer 1922 in FIG. 19, n– base region 2024 corresponding to second semiconductor layer 1924 in FIG. 19, p− base region 2026 corresponding to third semiconductor layer 1926 in FIG. 19, n+ cathode region 2033 corresponding to second cathode 1933 in FIG. 19, n+ SiGe cathode region 150 corresponding to first cathode line 1950 in FIG. 19, p-SiGe cathode region 2036 corresponding to second cathode line 1936 in FIG. 19, and p− Si region 2040 corresponding to substrate 1940 in FIG. 19. FIG. 20 illustrates an energy band diagram of a thyristor cell where a one-sided hole barrier 2056 is created inside an n+ silicon cathode region near the shallow trench isolation. The n+ doped cathode region may collectively refer to the n+ Si/n+ SiGe/p− SiGe heterostructure corresponding to regions 1833, 1850 and 1834. Because there is no hole barrier to the p− well/p− substrate 2040, minority carriers (e.g. holes) from ON cells can be collected at the heterojunction 2056 and drift to the substrate 2040 (e.g., p−well/p− substrate). On the other hand, this heterojunction 2056 blocks minority carriers (e.g., holes) from diffusing into OFF cells. A first electron affinity 2041, second electron affinity 2051, first bandgap 2010, second bandgap 2020, first valence band edge 2043 and second valence band edge 2053 in FIG. 20 may correspond to first electron affinity 1841, second electron affinity 1851, first bandgap 1810, second bandgap 1820, first valence band edge 1843 and second valence band edge 1853 of FIG. 18.

Figure 21:
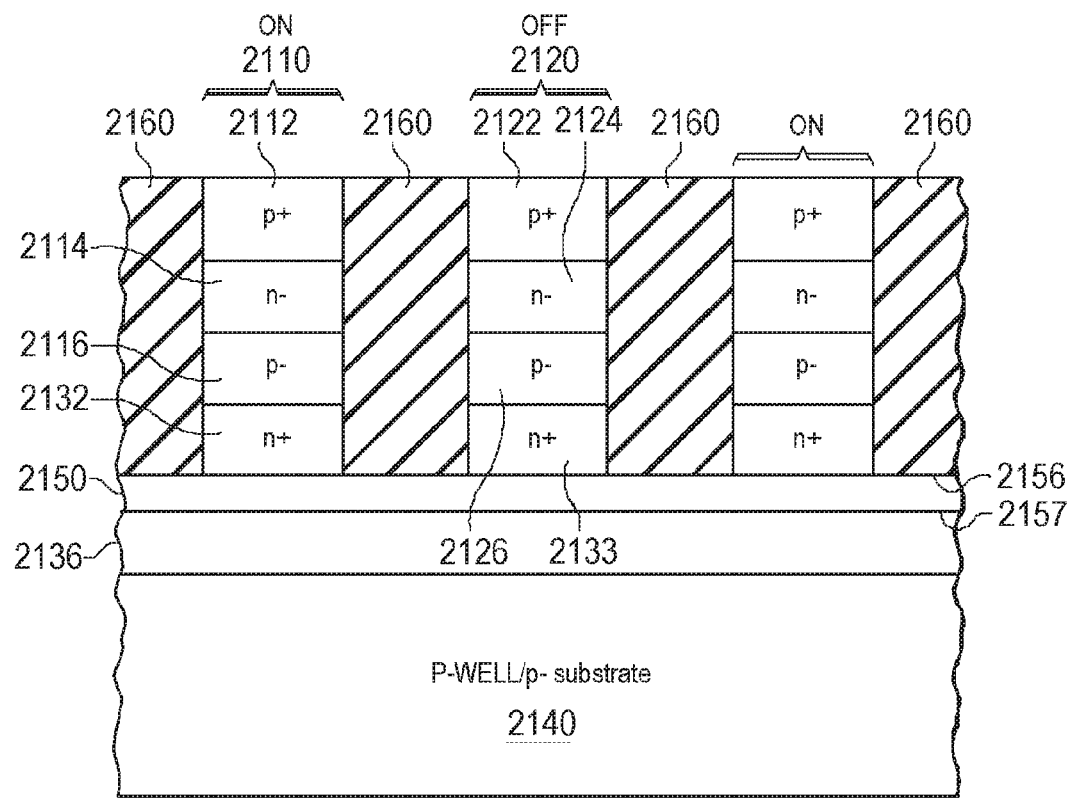
FIG. 21 illustrates a cross-sectional view of a simulated cell array that includes a minority carrier potential well formed in the cathode in accordance with some embodiments of the present disclosure.

FIG. 21 illustrates a cross-sectional view of a simulated cell array that includes a minority carrier potential well formed in the cathode in accordance with some embodiments of the present disclosure. FIG. 21 illustrates a TCAD simulation of a 3-cell array sharing the same cathode line. The structures of FIG. 21 correspond to those illustrated in FIGS. 17-20. For example, regions 2112, 2114, 2116, 2132, 2122, 2124, 2126, 2133, 2150, 2136, and 2140 may correspond to regions 1912, 1914, 1916, 1932, 1922, 1924, 1926, 1933, 1950, 1936, and 1940. Interfaces 2156 and 2157 may correspond to interfaces 2056 and 2057. After successful writing of all cells to an ON state, OFF state, and checkerboard pattern (e.g., checkerboard pattern of ON states and OFF states), FIG. 21 shows a map of hole concentration at the end of 1000 seconds of retention. The TCAD simulations demonstrate that the technique enables a reduced trench isolation depth. FIG. 21 illustrates that the minority hole barrier 2156 (e.g., at 2056 between regions 2033 and 2050, or at the interface between regions 1833 and 1850) is effective in blocking minority carriers from getting into the cathode regions of OFF cells (dark). For example, cathode 2133 remains dark, demonstrating a low concentration of minority carriers (e.g., holes).

Figure 22:
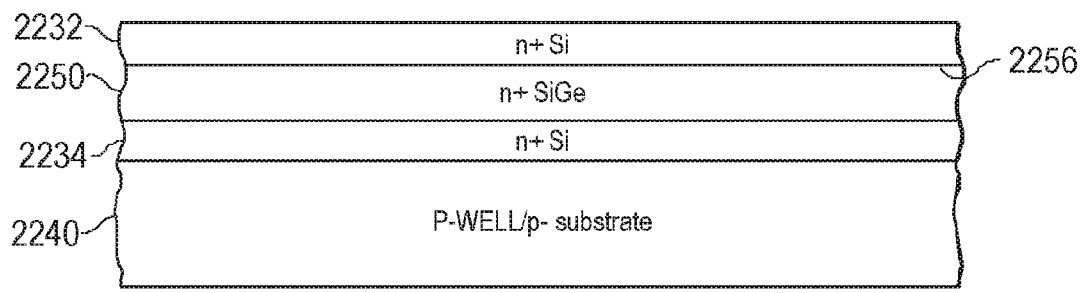
FIGS. 22-24 illustrate cross-sectional views as part of a process for manufacturing an array of thyristor memory cells in accordance with some embodiments of the present disclosure.
Figure 23:
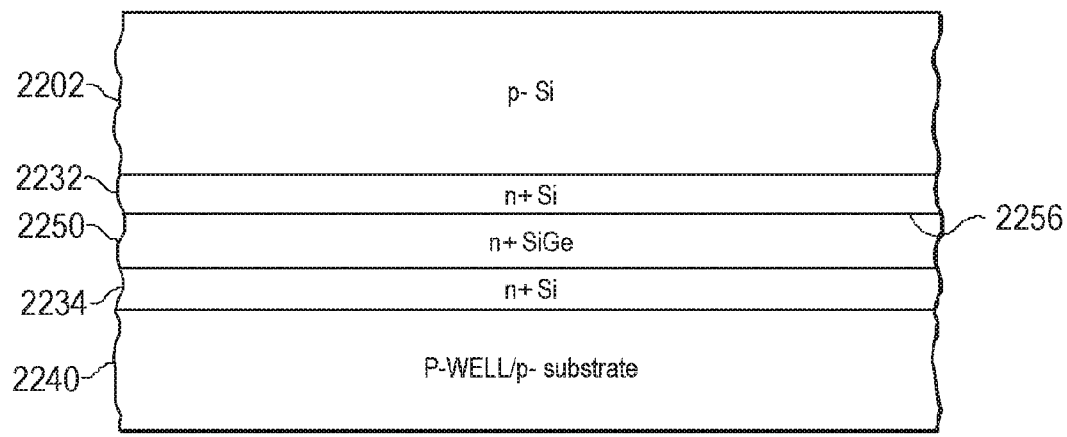
Figure 24:
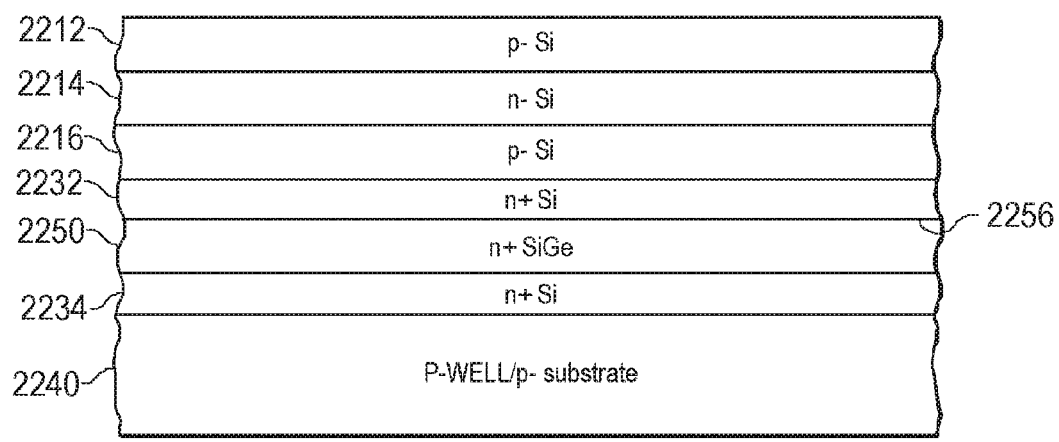

FIGS. 22-24 illustrate cross-sectional views as part of a process for manufacturing an array of thyristor memory cells in accordance with some embodiments of the present disclosure. FIGS. 22-24 illustrate a portion of a process flow for the making an array of the thyristor cells that include a potential well, as illustrated in FIGS. 17-18.

FIG. 22 illustrates formation of a first layer 2234 (e.g., by epitaxial growth of single crystalline in-situ doped n+ Si to a thickness of 50 nm~200 nm), formation of a second layer 2250 (e.g., by formation of single crystalline n+ SiGe to a thickness of 20 nm~200 nm)), and formation of a third layer 2232 (e.g., by formation of single crystalline n+ Si to a thickness of 50 nm~300 nm)) to form a potential well. A heterojunction at interface 2256 between the third layer and the second layer may form a potential barrier. In some embodiments, the first layer 2234 may be formed by doping (e.g., by ion implantation) of a bulk or thin film of semiconductor. For periphery integration, silicon in the cell array regions can be recessed and periphery may be covered by insulators such as oxide. The purpose is to have planar surface across the entire wafer. In some embodiments, Ge content in the strained SiGe layer 2250 can range from 10% to 50%.

FIG. 23 illustrates formation of a fourth layer 2202 (e.g., by growing single crystalline lightly in-situ doped p-type silicon) over the entire wafer after removal of protection oxide in the periphery. In some embodiments, silicon of cell array regions can be recessed for the full target stack thickness. Advantages of this method include in-situ doping of all thyristor layers and therefore may deliver better thickness control of each layers.

In some embodiments, for the design of the potential well structure illustrated in FIG. 23, it may be beneficial to form the second layer 2250 for the potential well (e.g., formed of n+ SiGe) so that the layer is thicker (e.g., >50 nm) and its barrier 2256 to minority carriers (e.g., a hole energy barrier at an interface between the first layer and second layer) higher (e.g., >100 meV). In some embodiments, Ohmic contact to the second layer 2250 (e.g., formed of n+ SiGe) is desirable so that most of the collected minority holes either recombine in the channel or are removed out to a contact (not shown).

FIG. 24 illustrates the formation of fifth layer 2216 on the third layer 2232, sixth layer 2214 on the fifth layer, and seventh layer 2212 on sixth layer. In some embodiments, the fourth layer 2202 may be divided into the fifth layer 2216 (e.g., a p− region of silicon) and sixth layer 2214 (e.g., an n− region of silicon) by an ion implantation step (e.g., implantation of an n-type dopant) followed by an annealing step. In some embodiments, the ion implantation step that divides the fourth layer 2202 into the fifth layer 2216 and sixth layer 2214 also divides the fourth layer into the fifth layer 2216, sixth layer 2214 and seventh layer 2212 (e.g., a p− region). In some embodiments, regions that constitute the seventh layer may be deposited after patterning and formation of the memory cells, in a process that forms islands of silicon, as discussed above in reference to FIG. 16. The plurality of layers (e.g., layers 2250, 2223, 2216, 2214, 2212) are subsequently processed in a manner similar to process steps described in reference to FIGS. 4A-6A, 4B-6B, 11A-15A, and 11B-15B. Care should be taken in trench etch and depth control such that the target trench isolation should overlap the n+ SiGe across process variations.

Figure 25:
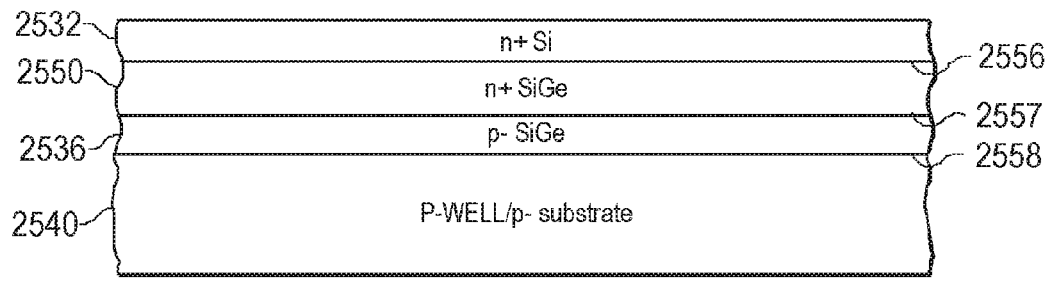
FIGS. 25-27 illustrate cross-sectional views as part of a process for manufacturing an array of thyristor memory cells that includes a potential barrier formed in the cathode in accordance with some embodiments of the present disclosure.
Figure 26:
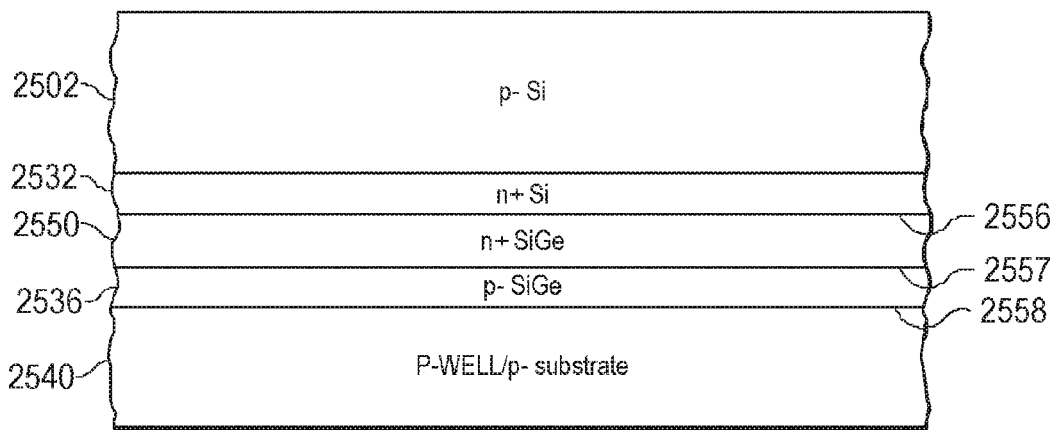
Figure 27:
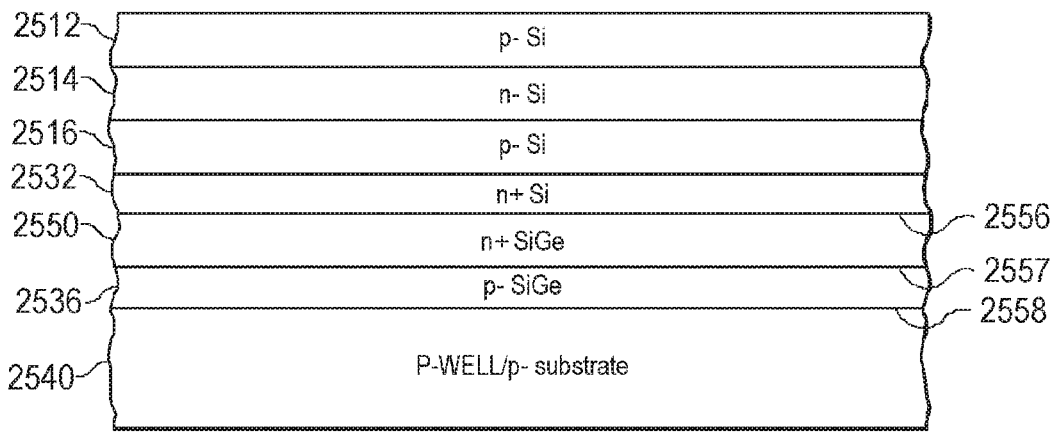

FIGS. 25-27 illustrate cross-sectional views as part of a process for manufacturing an array of thyristor memory cells that includes a potential barrier formed in the cathode in accordance with some embodiments of the present disclosure. FIGS. 25-27 illustrate a portion of a process flow for making an array of the thyristor cells illustrated in FIGS. 19-20.

FIG. 25 illustrates formation of a first layer 2536 (e.g., formed by epitaxial growth of single crystalline in-situ doped p− SiGe to a thickness of 50 nm~100 nm, with graded Ge content starting from 0% and linearly increasing to 20%~50%). Within the same CVD chamber, second layer 2550 (e.g., formed of single crystalline n+ SiGe) and third layer 2532 (e.g., formed of single crystalline n+ Si) are grown similarly to that shown in FIG. 22. A heterojunction at interface 2556 between the third layer and the second layer may form a potential barrier. Interface 2557 may correspond to interface 2057 and interface 2558 may correspond to interface 2058 from FIG. 20.

FIG. 26 illustrates formation of a fourth layer 2502 (e.g., single crystalline lightly in-situ doped p-type silicon), which is then grown over the entire wafer after removal of protection oxide in the periphery. In some embodiments, silicon of cell array regions can be recessed for the full target stack thickness. Advantages of this method include in-situ doping of all thyristor layers and therefore it may deliver better thickness control of each layers.

FIG. 27 illustrates the formation of fifth layer 2516 on the third layer 2532, sixth layer 2514 on the fifth layer, and seventh layer 2512 on the sixth layer. In some embodiments, the fourth layer 2502 may be divided into the fifth layer 2516 (e.g., a p− region of silicon) and sixth layer 2514 (e.g., an n− region of silicon) by an ion implantation step (e.g., implantation of an n-type dopant) followed by an annealing step. In some embodiments, the ion implantation step that divides the fourth layer 2502 into the fifth layer 2516 and sixth layer 2514 also divides the fourth layer into the fifth layer 2516, sixth layer 2514 and seventh layer 2512 (e.g., a p− region). In some embodiments, regions that constitute the seventh layer may be deposited after patterning and formation of the memory cells, in a process that forms islands of silicon, as discussed above in reference to FIG. 16. The plurality of layers (e.g., layers 2550, 2523, 2516, 2514, 2512) are subsequently processed in a manner similar to process steps described in reference to FIGS. 4A-6A, 4B-6B, 11A-15A, and 11B-15B. Care should be taken in trench etch and depth control such that the target trench isolation should overlap the n+ SiGe across process variations.

In some embodiments, the structures described in reference to FIGS. 3, 17 and 19, may be combined and the fabrication processes described in reference to FIGS. 4A-B through 15A-B may be modified accordingly. In some embodiments, cathode line 354 of FIG. 3 may include an MCLK material and potential well. For example, the MCLK material may be fabricated as a continuous region above the potential well structure of FIG. 17. The MCLK material may be fabricated as a layer on a first heavily doped layer of silicon (e.g., n+ silicon or p+ silicon). The first heavily doped layer of silicon may be fabricated on top of a heavily doped layer of Silicon Germanium (e.g., p+ SiGe or n+ SiGe). The heavily doped layer of Silicon Germanium may be fabricated on top of a second heavily doped layer of silicon (e.g., n+ silicon or p+ silicon). For example, the MCLK region may be fabricated as continuous region below the potential well. For example, the first heavily doped layer of silicon may be fabricated on a heavily doped layer of silicon germanium, which is fabricated on a second heavily doped layer of silicon, thereby forming a potential well. The MCLK region may be fabricated below the second heavily doped region of silicon.

In some embodiments, cathode line 354 of FIG. 3 may include a one-sided potential barrier and an MCLK region. For example, a one-sided potential barrier illustrated in FIG. 19 may be fabricated above an MCLK region. In this example, minority carriers may be directed away from the one-sided potential barrier into the MCLK region where the minority carriers may recombine. For example, an MCLK region may be fabricated above a one-sided potential barrier.

In some embodiments, cathode line 354 of FIG. 3 may include a one-sided potential barrier and a potential well. For example, a one sided potential barrier illustrated in FIG. 19 may be fabricated above a potential well illustrated in FIG. 17. In this example, minority carriers may be directed away from the one-sided potential barrier into the potential well where the minority carrier may recombine. For example, a potential well may be fabricated above a one-sided potential barrier. It should be understood that the aforementioned combinations could be fabricated in any suitable order (e.g., potential well first, followed by MCLK region, or vice versa).

Although the embodiment and examples used bulk vertical thyristors of the pnpn type, the invention equally applies to other types of thyristor-based memory cells and arrays. These include bulk vertical npnp thyristors, planar lateral pnpn or npnp thyristors, gated or un-gated.

For an npnp type thyristor, one needs to switch minority carrier from hole type to electron type. This can be achieved by using different strains or materials.

Although the aforementioned embodiments used a pnpn configuration to illustrate alternative cell designs, the same methods and process techniques may be used to form npnp stacks by reversing n-type to p-type, and vice versa.

This description has been presented for the purposes of illustration. It is not intended to be exhaustive or to limit the invention to the precise form described, and many modifications and variations are possible in light of the teaching above. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A plurality of volatile memory cells comprising:
   a first silicon thyristor comprising a first cathode formed from a first material;
   a second silicon thyristor comprising a second cathode formed from the first material;
   a first cathode line, formed from a conductor material, connecting the first cathode of the first silicon thyristor and the second cathode of the second silicon thyristor, and wherein a minority carrier lifetime of a minority carrier is shorter in the conductor material than in the first material; and
   a first isolation insulator region separating a first portion of the first silicon thyristor and a second portion of the second silicon thyristor.

2. The plurality of volatile memory cells of claim 1, wherein the conductor material comprises a metal silicide material formed from a transition metal comprising at least one of a Group 9 metal and a Group 10 metal.

3. The plurality of volatile memory cells of claim 2, wherein the metal silicide material is formed from the transition metal comprising at least one of cobalt, platinum, palladium, and nickel.

4. The plurality of volatile memory cells of claim 2, wherein the metal silicide material is formed from the transition metal having a higher diffusivity than silicon during a silicidation reaction at a temperature less than 900 degrees Celsius.

5. The plurality of volatile memory cells of claim 1, wherein the first cathode line comprises a first metal silicide region merged with a second metal silicide region.

6. The plurality of volatile memory cells of claim 1, wherein the first silicon thyristor comprises a first anode and the second silicon thyristor comprises a second anode, and wherein the first anode and the second anode are single crystalline silicon regions formed by a selective epitaxial growth process.

7. A memory device comprising:
   an array of memory cells, comprising:
      a first silicon thyristor comprising a first cathode formed from a first material;
      a second silicon thyristor comprising a second cathode formed from the first material;

a third silicon thyristor;

a first cathode line, formed from a conductor material, connecting the first cathode of the first silicon thyristor and the second cathode of the second silicon thyristor, and wherein a minority carrier lifetime of a minority carrier is shorter in the conductor material than in the first material;

a first isolation insulator region separating a first portion of the first silicon thyristor and a second portion of the second silicon thyristor; and a second isolation insulator region separating a third portion of the first silicon thyristor and a fourth portion of the third silicon thyristor.

8. The memory device of claim 7, wherein the conductor material comprises a metal silicide material formed from the transition metal having a higher diffusivity than silicon during a silicidation reaction at a temperature less than 900 degrees Celsius.

9. The memory device of claim 7 wherein the first cathode line comprises a first metal silicide region merged with a second metal silicide region.

* * * * *